(12) United States Patent
Fujimoto

(10) Patent No.: US 12,112,788 B2
(45) Date of Patent: Oct. 8, 2024

(54) HOST APPARATUS AND EXTENSION DEVICE

(71) Applicant: KIOXIA CORPORATION, Tokyo (JP)

(72) Inventor: Akihisa Fujimoto, Yamato (JP)

(73) Assignee: KIOXIA CORPORATION, Tokyo (JP)

( * ) Notice: Subject to any disclaimer, the term of this patent is extended or adjusted under 35 U.S.C. 154(b) by 57 days.

(21) Appl. No.: 18/165,565

(22) Filed: Feb. 7, 2023

(65) Prior Publication Data

US 2023/0186967 A1  Jun. 15, 2023

Related U.S. Application Data

(63) Continuation of application No. 17/481,701, filed on Sep. 22, 2021, now Pat. No. 11,605,415, which is a
(Continued)

(30) Foreign Application Priority Data

Mar. 16, 2016 (JP) ................................. 2016-052000

(51) Int. Cl.
*G11C 11/40* (2006.01)
*G11C 7/22* (2006.01)
(Continued)

(52) U.S. Cl.
CPC .......... *G11C 11/4074* (2013.01); *G11C 7/222* (2013.01); *G11C 11/409* (2013.01);
(Continued)

(58) Field of Classification Search
None
See application file for complete search history.

(56) References Cited

U.S. PATENT DOCUMENTS 6,038,186 A   3/2000   Tanizaki
6,052,742 A   4/2000   Kirinaka
(Continued)

FOREIGN PATENT DOCUMENTS

JP   2009-258773 A   11/2009
JP   2013-513836 A   4/2013
(Continued)

OTHER PUBLICATIONS

International Search Report and Written Opinion issued Aug. 4, 2017 in PCT/JP2017/011561 filed Mar. 15, 2017.

*Primary Examiner* — Tan T. Nguyen
(74) *Attorney, Agent, or Firm* — Oblon, McClelland, Maier & Neustadt, L.L.P.

(57) ABSTRACT

According to one embodiment, a first power-supply voltage is applied to I/O cells, an I/O cell connected to a clock terminal is initially set to a threshold of a second voltage signaling, an I/O cell connected to a command terminal and I/O cells connected to data terminals are initially set as an input, and when a clock control unit detects receipt of one clock pulse and a signal voltage control unit detects a host using the second voltage signaling, a signal voltage control unit drives the I/O cell of a first data terminal high level after a second power-supply voltage is applied to I/O cells and the threshold of a second voltage signaling is set to I/O cells of the clock, command and data terminals.

11 Claims, 22 Drawing Sheets

Related U.S. Application Data continuation of application No. 16/913,027, filed on Jun. 26, 2020, now Pat. No. 11,158,365, which is a continuation of application No. 16/084,094, filed as application No. PCT/JP2017/011561 on Mar. 15, 2017, now Pat. No. 10,741,236.

(51) Int. Cl.

| | | |
|---|---|---|
| *G11C 11/4074* | (2006.01) | |
| *G11C 11/409* | (2006.01) | |
| *G11C 29/02* | (2006.01) | |
| *G11C 29/50* | (2006.01) | |
| *G11C 5/14* | (2006.01) | |

(52) U.S. Cl.
CPC ...... *G11C 29/023* (2013.01); *G11C 29/50004* (2013.01); *G11C 5/14* (2013.01); *G11C 5/144* (2013.01)

(56) References Cited

U.S. PATENT DOCUMENTS

| | | | |
|---|---|---|---|
| 6,333,895 B1 | 12/2001 | Hamamoto | |
| 7,439,797 B2 | 10/2008 | Byeon | |
| 7,694,067 B2 * | 4/2010 | Mizushima | G06K 19/07732 365/185.33 |
| 8,321,697 B2 | 11/2012 | Fujimoto | |
| 9,141,398 B2 | 9/2015 | Fujimoto | |
| 10,741,236 B2 | 8/2020 | Fujimoto | |
| 11,158,365 B2 | 10/2021 | Fujimoto | |
| 2002/0060947 A1 | 5/2002 | Hatae | |
| 2007/0051806 A1 | 3/2007 | Fujimoto | |
| 2008/0149715 A1 | 6/2008 | Fujimoto | |
| 2009/0224042 A1 | 9/2009 | Fujimoto | |
| 2010/0254202 A1 * | 10/2010 | Asauchi | G06F 13/4291 365/189.17 |
| 2010/0322017 A1 | 12/2010 | Fujimoto | |
| 2011/0026355 A1 | 2/2011 | Irisawa | |
| 2011/0058420 A1 | 3/2011 | Yamada | |
| 2011/0114737 A1 | 5/2011 | Fujimoto | |
| 2012/0176855 A1 | 7/2012 | Fujimoto | |
| 2013/0013882 A1 | 1/2013 | Fujimoto | |
| 2013/0166843 A1 | 6/2013 | Fujimoto | |
| 2013/0250710 A1 | 9/2013 | Nakano | |
| 2014/0068111 A1 | 3/2014 | Fujimoto | |
| 2014/0351514 A1 | 11/2014 | Fujimoto | |
| 2015/0234596 A1 | 8/2015 | Fujimoto | |
| 2016/0188245 A1 | 6/2016 | Thadi Suryaprakash | |
| 2017/0192475 A1 | 7/2017 | Fujimoto et al. | |
| 2017/0192706 A1 | 7/2017 | Fujimoto et al. | |
| 2017/0192919 A1 | 7/2017 | Ono | |
| 2018/0330673 A1 | 11/2018 | Kang | |
| 2019/0371372 A1 | 12/2019 | Kim | |

FOREIGN PATENT DOCUMENTS

| | | |
|---|---|---|
| JP | 2013-101636 A | 5/2013 |
| JP | 2013-214221 A | 10/2013 |
| JP | 2015-215841 A | 12/2015 |
| KR | 10-2010-0114937 A | 10/2010 |
| WO | WO 2006/057340 A1 | 6/2006 |
| WO | WO 2016/009692 A1 | 1/2016 |

* cited by examiner

| 47 | 46 | 45:40 | 39:20 | 19:16 | 15:08 | 07:01 | 00 |
|---|---|---|---|---|---|---|---|
| S | T | Index | Reserved | VHS | Check Pattern | CRC7 | E |
| 0 | 1 | 010100b | 00000h | xxxxb | xxh | xx | 1 |

Voltage Host Supplied
0000b: Not Defined
0001b: VDD:2.7V-3.6V, 3.3V signaling
0010b: VDD:2.7V-3.6V, 1.8V signaling
0100b: Reserved
1000b: Reserved
Others: Not Defined

Check Pattern
10101010b: VDD: 3.3V Rage, 3.3V Signaling
10100101b: VDD: 3.3V Rage, 1.8V Signaling

FIG. 7

HOST APPARATUS AND EXTENSION DEVICE

CROSS-REFERENCE TO RELATED APPLICATIONS

This application is a continuation of and claims benefit under 35 U.S.C. § 120 to U.S. application Ser. No. 17/481,701, filed Sep. 22, 2021, which is a continuation of and claims benefit under 35 U.S.C. § 120 to U.S. application Ser. No. 16/913,027, filed Jun. 26, 2020 (now U.S. Pat. No. 11,158,365), which is a continuation of and claims benefit under 35 U.S.C. § 120 to U.S. application Ser. No. 16/084,094, filed Sep. 11, 2018 (now U.S. Pat. No. 10,741,236), which is a U.S. national stage application of PCT/JP20117/0111561, filed Mar. 15, 2017, which is based upon and claims the benefit of priority under 35 U.S.C. § 119 from Japanese Patent Application No. 2016-052000, filed Mar. 16, 2016, the entire contents of each of which are incorporated herein by reference.

FIELD

Embodiments described herein relate generally to a host apparatus and an extension device.

BACKGROUND

With finer semiconductor integrated circuits (IC), there have been demanded lower IC voltages and I/O signal voltages. Meanwhile, in situations in which host apparatuses and extension devices compatible with high power-supply voltages are distributed, host apparatuses and extension devices compatible with high power-supply voltage interfaces and low power-supply voltage interfaces may be used in mixture.

When the input of an input buffer is in a floating state or a middle voltage is input into the input buffer, a flow-through current may flow into the input buffer. In particular, the high level of a low voltage signaling may be a middle voltage of a high voltage signaling. Accordingly, when host apparatuses and extension devices operating under different signal voltages are connected, a flow-through current may flow into the input buffer. Hereinafter, the high voltage signaling will be expressed as HVS and the low voltage signaling will be expressed as LVS.

CITATION LIST

Patent Literature

[PTL 1] WO2006/057340

BRIEF DESCRIPTION OF THE DRAWINGS

FIG. 7 is a diagram illustrating the contents of a CMD8 in an LVS SD card transmitted by the host according to the first embodiment;

DETAILED DESCRIPTION

Figure 1:
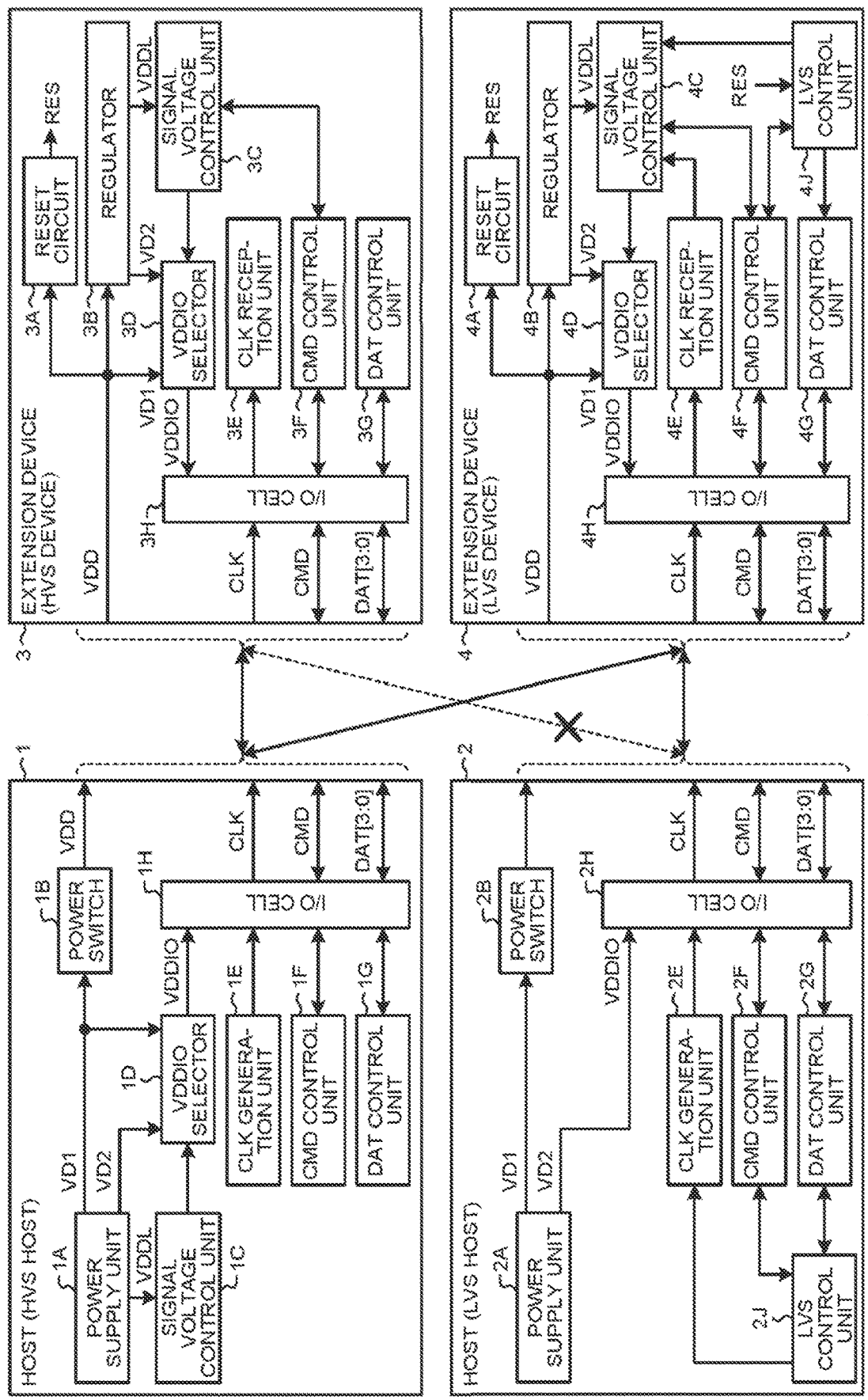
FIG. 1 is a schematic block diagram of host apparatuses and extension devices according to a first embodiment. The HVS host represents a host 1 that starts communications by a high voltage signaling, the LVS host represents a host 2 that starts communications by a low voltage signaling, the HVS device represents an extension device 3 that starts communications by a high voltage signaling, and the LVS device represents an extension device 4 that starts communications selecting a high voltage signaling or a low voltage signaling depending on the kind of the host apparatus.

In general, according to one embodiment, an extension device is supplied with a first power voltage from a host and communicates with the host via signals of a clock, a command/response, and data. As input/output signal levels of the foregoing signals, a first voltage signaling and a second voltage signaling lower than the first voltage signaling are usable for the communication. The extension device includes: a power/ground terminal that is supplied with power from the host; a clock terminal that inputs the clock; a command terminal that receives the command and transmits the response; a plurality of data terminals that perform the input and output of the data; an I/O cell unit that is connected to the clock terminal, the command terminal, and the data terminals; a clock control unit that is capable of determining the number of clocks input into the clock terminal; and a signal voltage control unit that controls the levels of the input/output signals of the I/O cell unit and controls a threshold for determining High/Low of the input signals. An I/O cell connected to the clock terminal is initially set to a threshold of the second voltage signaling, and an I/O cell connected to the command terminal and I/O cells connected to the data terminals are initially set to operate with the first voltage signaling as an input. When the clock control unit detects the receipt of one clock pulse, the signal voltage control unit drives the I/O cell of the first data terminal in a direction in which the voltage level of a first data terminal is inverted.

Exemplary embodiments of a host apparatus and an extension device will be explained below in detail with reference to the accompanying drawings. The present invention is not limited to the following embodiments. The extension device here refers to a device that can externally add its function to the host apparatus by being attached to a slot in the host apparatus. The external addition of the function may be the addition of a function the host device does not have, or may be a reinforcement of a function the host device has. The extension device operates only when being connected to the host apparatus and cannot operate singly in an autonomous manner. That is, the extension device can receive power, clocks, and commands from the host apparatus, and return responses to the commands or transmit and receive data. The slot may include a power terminal, a clock terminal, a command terminal, and a data terminal. The clock terminal, the command terminal, and the data terminal can be used as signal terminals. Attaching the extension device to the host apparatus makes it possible to improve the diversity and flexibility of functions of the host apparatus.

The extension device may be a memory card or an I/O card. The functions of the I/O card may include GPS, camera, Wi-Fi (registered trademark), FM radio, Ethernet (registered trademark), barcode reader, Bluetooth (registered trademark), and the like, for example. The host apparatus has a slot as receptor of the extension device, and can send power, clocks, and commands, receive responses to the commands, and transmit and receive data via the slot. The host apparatus may be a personal computer, a mobile information terminal such as a smartphone, a peripheral such as a printer or a photocopier, or a home information appliance such as a refrigerator or a microwave oven. However, the present invention is not limited to these embodiments.

First Embodiment

FIG. 1 is a schematic block diagram of host apparatuses and extension devices according to a first embodiment. FIG. 1 illustrates hosts 1 and 2 and extension devices 3 and 4 with extraction of their respective interface units through which the hosts 1, 2 and the extension devices 3, 4 communicate via bus interface signals of power, clock, command/response, and data.

Referring to FIG. 1, the extension devices 3 and 4 are detachably attached to the hosts 1 and 2. The host 1 can use the extension devices 3 and 4. The host 1 can send a command to the extension devices 3 and 4 to initialize the devices, and receive responses from the extension devices 3 and 4. The host 2 can use the extension device 4 but cannot use the extension device 3. The host 2 can send a command to the extension device 4 to initialize the device and receive a response from the extension device 4. The host 1 and the extension devices 3 and 4 can communicate with each other by a high voltage signaling, and the host 2 and the extension device 4 can communicate by a low voltage signaling.

For example, a high voltage signaling can be set to near 3.3 V and a low voltage signaling can be set to near 1.8 V. The high voltage signaling is a signal communicated under a high voltage, and the low voltage signaling is a signal communicated under a low voltage. The signals can include a clock CLK, data DAT[3:0], and a command CMD. A power-supply voltage is supplied from the hosts 1 and 2 to voltage can be set to a high power-supply voltage. For example, the power-supply voltage can be set to 3.3 V (2.7 to 3.6 V).

The extension device 3 operates by a high voltage signaling at the start of initialization and can switch the signal level from the high voltage signaling to a low voltage signaling in the middle of the initialization. The host 1 and the extension device 3 can operate in conformity with UHS-I standards for SD card, for example. The host and device compatible with high voltage signaling (HVS) will be hereinafter called HVS host and HVS device. A combination of the host 2 and the extension device 4 can operate by a low voltage signaling continuously from the start of the initialization without using a high voltage signaling. The host and device compatible with low voltage signaling (LVS) will be hereinafter called LVS host and LVS device.

The host 1 includes a power supply unit 1A, a power switch 1B, a signal voltage control unit IC, a VDDIO selector 1D (VDDIO is a power source for I/O cell), a clock generation unit 1E, a command control unit 1F, a data control unit 1G, and an I/O cell 1H. The host 2 includes a power supply unit 2A, a power switch 2B, a clock generation unit 2E, a command control unit 2F, a data control unit 2G, an I/O cell 2H, and an LVS control unit 2J.

The power supply units 1A and 2A generate power-supply voltages VD1, VD2, and VDDL. For example, the power-supply voltage VD1 can be set to 3.3V (2.7 to 3.6 V), the power-supply voltage VD2 can be set to 1.8 V, and the power-supply voltage VDDL can be set to 1.2 V. The power-supply voltage VDDL can be used as power source for a logic circuit. The power switches 1B and 2B turn on and off the supply of the power-supply voltage VD1 to the power line VDD. The power switches 1B and 2B can include a pull-down circuit that pulls down the output voltage to ground potential.

The signal voltage control unit 1C instructs for switching the signal level from a high voltage to a low voltage in an initialization sequence. The VDDIO selector 1D selects either one of the power-supply voltages VD1 and VD2 as cell power supply VDDIO, and supplies the sane to the I/O cell 1H. The clock generation units 1E and 2E generate a clock CLK at a predetermined frequency. The command control unit 1F sends a command CMD to the extension devices 3 and 4 or receives responses to the command CMD from the extension devices 3 and 4.

The data control units 1G and 2G transmit and receive the data DAT[3:0] to and from the extension devices 3 and 4. The I/O cell 1H sets the signal levels of the clock CLK, the command CMD, the response to the command CMD, and the data DAT[3:0] according to either one of the power-supply voltages VD1 and VD2 specified by the cell power supply VDDIO. The I/O cell 2H sets the signal levels of the clock CLK, the command CND, the response to the command CND, and the data DAT[3:0] according to the power-supply voltage VD2 specified by the cell power supply VDDIO.

The LVS control unit 2J determines whether the extension devices 3 and 4 are HVS devices or LVS devices. The LVS control unit 2J can include a device detection unit that detects whether a device is communicable by a low voltage signaling. According to the determination result, the LVS control unit 2J controls the sequence and signal levels of the clock CLK, the command CMD, the response to the command. CMD, and the data DAT[3:0]. The signal levels can be selected from among High drive, Low drive, pull-up, pull-down, and output Tristate (input state).

The process performed by the host 2 to determine whether the extension devices 3 and 4 are HVS devices or LVS devices (hereinafter, also called pre-processing) can be performed before the initialization process. In the pre-processing, the LVS host can indicate that it is an LVS host by driving the voltage of the data DAT[3] to Low. The HVS host can set the voltage of the data DAT[3] to High when an LVS device is attached (the detailed description will be given later with reference to FIG. 3A). The LVS host can also monitor the voltage of data DAT[2].

When pulling up the data DAT[2], the host 2 can determine the device as an LVS device when the voltage of the data DAT[2] is Low, and can determine the device as an HVS device when the voltage of the data DAT[2] is High. When determining the device as an LVS device, the host 2 moves to the initialization process. When determining the device as an HVS device, the host 2 stops the driving of the I/O cell output, powers off the device, and rejects the HVS device.

The extension device 3 includes a reset circuit 3A, a regulator 3D, a signal voltage control unit 3C, a VDDIO selector 3D, a clock reception unit 3D, a command control unit 3D, a data control unit 3G, and an I/O cell 3H. The extension device 4 includes a reset circuit 4A, a regulator 4B, a signal voltage control unit 4C, a VDDIO selector 4D, a clock reception unit 4E, a command control unit 4F, a data control unit 4G, an I/O cell 4H, and an LVS control unit 4J.

The reset circuits 3A and 4A determine whether the power-supply voltage VD1 is supplied within an operating voltage range, and output a reset signal RES to reset a logic circuit. The regulators 3B and 4B convert the power-supply voltage VD1 into the power-supply voltages VD2 and VDDL. The signal voltage control units 3C and 4C instruct for switching the signal level from a high voltage to a low voltage. The VDDIO selectors 3D and 4D select either one of the power-supply voltage VD1 and VD2 as cell power supply VDDIO, and supply the same to the I/O cells 3H and 4H, respectively. The clock reception units 3E and 4E receive the clock CLK and distribute the same to the logic circuit. The command control units 3F and 4F receive the command CMD from the hosts 1 and 2 and send a response to the command CMD to the hosts 1 and 2. When the command CMD is input, the command control units 3D and 4F can decode the command number, recognize the function to be executed, and return a response to the hosts 1 and 2.

The data control units 3G and 4G transmit and receive the data DAT[3:0] to and from the hosts 1 and 2. The I/O cells 3H and 4H set the signal levels of the clock CLK, the command CMD, the response to the command CMD, and the data DAT[3:0] according to either one of the power-supply voltages VD1 and VD2 specified by the cell power supply VDDIO. The LVS control unit 4J determines whether the hosts 1 and 2 are HVS hosts or LVS hosts. Then, according to the determination result, the LVS control unit 4J controls the sequence and signal levels of the clock CLK, the command CMD, the response to the command CMD, and the data DAT[3:0]. The signal levels can be selected from among High drive, Low drive, pull-up, pull-down, and output Tristate (input state).

The process performed by the extension device 4 to determine whether the hosts 1 and 2 are HVS host or LVS hosts (hereinafter, also called pre-processing) can be performed before the initialization process. Initially, the cell power supply VDDIO connects to the power-supply voltage VD1. In the pre-processing, the LVS device can monitor the voltage of the data DAT[3]. Since the data DAT[3] is pulled up by a device detection resistor R4 illustrated in FIG. 3B, the device can determine the host as LVS host when the voltage of the data DAT[3] is Low (Low-driven), and the device can determine the host as HVS host when the voltage of the data DAT[3] is High.

When determining the host as LVS host, the extension device 4 drives the voltage of the data DAT[2] to Low and turns on the regulator 4B for generating the power-supply voltage VD2. After the power-supply voltage VD2 becomes stable, the extension device 4 can switch the cell power supply VDDIO to the power-supply voltage VD2. When determining the host as HVS host, the extension device 4 keeps the cell power supply VDDIO under the power-supply voltage VD1. The HVS device does not drive the data DAT[2].

The power supply units 1A, 2A, the power switches 1B, 2B, the regulators 3B, 4B, and the I/O cells 1H to 4H can be formed from analog circuits. The reset circuits 3A, 4A, the signal voltage control unit 1C, the VDDIO selectors 1D, 3D, and 4D, the clock generation units 1F to 4E, the command control units 1F to 4F, and the data control units 1G to 4G can be formed from logic circuits. The command control units 1F to 4F, the data control units 1G to 4G, and the LVS control units 2J and 4J implemented through firmware processing by the processor.

It is assumed that the extension device 3 is connected to the host 1. The host 1 turns on the power switch 1B by the power-supply voltage VD1 to supply the power-supply voltage VD1 to the extension device 3 via the power line VDD. The host 1 pulls up the voltages of the command CMD and the data DAT[2:0]. The device detection resistor of the extension device 3 pulls up the voltage of the data DAT[3]. When the power-supply voltage VD1 becomes stable, the host 1 starts the initialization process. At this time, the host 1 sends the clock CLK and issues the command CMD to the extension device 3.

The extension device 3 returns a response to the command CMD (excluding the command CMD0 to the host 1. In this case, the host 1 issues a command CMD8 as a voltage check command. A command argument 0001b is set to a field VES of the command CMD8. Upon receipt of the command CMD8, the extension device 3 checks the command argument. When the command argument is 0001b, the extension device 3 returns a response to the command CMD8 to the host 1. Upon receipt of the response to the command CMD8, the host 1 recognizes that the initialization can be further continued.

It is assumed that the extension device 4 is connected to the host 1. The host 1 turns on the power switch 1B by the power-supply voltage VD1 to supply the power-supply voltage VD1 to the extension device 4 via the power line VDD. The host 1 pulls up the voltages of the command CMD and the data DAT[2:0]. The device detection resistor of the extension device 4 pulls up the voltage of the data DAT[3]. When the power-supply voltage VD1 becomes stable, the extension device 4 monitors the voltage of the data DAT[3]. The extension device 4 determines the host 1 as HTV host when the voltage of the data DAT[3] is High. When determining the host 1 as HVS host, the extension device 4 keeps the cell power supply VDDIO under the power-supply voltage VD1 and does not drive the data DAT[2].

The host 1 starts the initialization process. At this time, the host 1 sends the clock CLK and issues the command CMD to the extension device 4. The extension device 4 returns a response to the command CMD (excluding the command CMD0) to the host 1. In this case, the host 1 issues the command CMD8 as a voltage check command. The command argument 0001b is set to the field VHS of the command CMD8. Upon receipt of the command CMD8, the extension device 4 checks the command argument. When the command argument is 0001b and no error has occurred in the procedure so far, the extension device 4 returns a response to the command CMD8 to the host 1. Upon receipt of the response to the command CMD8, the host 1 recognizes that the extension device 4 can continue the initialization process by a high voltage signaling.

It is assumed that the extension device 3 is connected to the host 2. At this time, the host 2 drives a clock SDCLK and the data DAT[3] to Low. This prevents the voltage of the data DAT[3] from being pulled up to the power-supply voltage VD1 via the device detection resistor of the extension device 3. In addition, the host 2 turns on the power switch 2B by the power-supply voltage VD1 to supply the power-supply voltage VD1 to the extension device 3 via the power line DD. The voltages of the command IND and the data DAT[2:0] are pulled down by a pull-up resistor of the host 2. At this time, no pull-up voltage is applied to the pull-up resistor. Alternatively, the host 2 may drive the voltages of the command CMD and the data DAT[2:0] to Low.

When the setup time of the LVS device has passed after the stabilization of the power-supply voltage VD1, the host 2 supplies voltage via the pull-up the data DAT[2] via the pull-up resistor. Then, the host 2 determines the extension device 3 as an HVS device when the voltage of the data DAT[2] is High. At this time, since the voltage of the data DAT[2] is not driven by the extension device 3, when the voltage of the data DAT[2] is pulled up, the voltage of the data DAT shifts from Low to High. When determining that the extension device 3 as an HVS device, the host 2 stops the supply of the pull-up voltage, stops the driving of the I/O cell output, and rejects the extension device 3.

It is assumed that the extension device 4 is connected to the host 2. At this time, the host 2 drives the clock SDCLK and the data DAT[3] to Low. This prevents the voltage of the data DAT[3] from being pulled up to the power-supply voltage VD1 via the device detection resistor of the extension device 4. In addition, the host 2 turns on the power switch 2B by the power-supply voltage VD1 to supply the power-supply voltage VD1 to the extension device 4 via the power line VDD. The voltages of the command CMD and the data DAT[2:0] are pulled down by the pull-up resistor of the host 2. At this time, no pull-up voltage is applied to the pull-up resistor. Alternatively, the host 2 may drive the voltages of the command. CMD and the data DAT[2:0] to Low.

When the setup time of the LVS device has passed after the stabilization of the power-supply voltage VD1, the host 2 supplies the pull-up voltage to pull up the data DAT[2] via the pull-up resistor. Then, the host 2 determines the extension device 4 as an LVS device when the voltage of the data DAT[2] is Low. At this time, since the voltage of the data DAT[2] is driven to Low by the extension device 4, the voltage of the data DAT[2] can be kept Low even when the voltage of the data DAT[2] is pulled up.

Meanwhile, the extension device 4 monitors the voltage of the data DAT[3]. The extension device 4 determines the host 2 an LVS host when the voltage of the data DAT[3] is Low. When determining the host 2 as an LVS host, the extension device 4 drives the voltage of the data DAT[2] to Low and turns on the regulator 4B for generating the power-supply voltage VD2. After the power-supply voltage VD2 becomes stable, the extension device 4 switches the cell power supply VDDIO to the power-supply voltage VD2.

The host 2 pulls up the command CMD and the data DAT[3:0]. Then, the host 2 starts the initialization process. At this time, the host 2 sends the clock CLK and issues the command CMD to the extension device 4. The clock CLK and the command CMD are sent by a low voltage signaling. The extension device 4 returns a response to the command CMD (excluding the command CMD0) to the host 2.

In this case, the host 2 issues the command CMD8 as a voltage check command. The command argument 00010b is set to the field VHS of the command CMD8. Upon receipt of the command CMD8, the extension device 4 checks the command argument. When the command argument is 00110b and no error has occurred in the procedure so far, the extension device 4 returns a response to the command CMD8 to the host 2. This response is sent by a low voltage signaling. Upon receipt of the response to the command CMD8, the host 2 recognizes that the extension device 4 can continue the initialization process by a low voltage signaling.

In the process by the host 2 to determine whether the extension devices 3 and 4 are HVS devices or LVS devices, setting the voltages of the clock CLK, the data DAT[3:0], and the command CMD to Low makes it possible to prevent input of a middle voltage into the input buffers of the extension devices 3 and 4 and prevent the flowing of a flow-through current into the input buffers.

The data DAT[2] is activated to Low in the LVS device, and the data DAT[2] is not activated in the HVS device. Accordingly, the host 2 can determine whether the extension devices 3 and 4 are HVS devices or LVS devices by detecting the voltage of the data DAT[2] when pulling up the data DAT[2]. At this time, since the voltage of the data DAT[2] is kept Low in the LVS device, it is possible to prevent input of a middle voltage into the input buffer of the extension device 4 and prevent flowing of a flow-through current into the input buffer.

Meanwhile, in the HVS device, the voltage of the data DAT[2] becomes High, but the host 2 can stop the driving of the extension device 3 at once to reduce the influence of a flow-through current even though the flow-through current flows into the input buffer. The process can be performed for several micro seconds under the control of the logic circuit.

Figure 2:
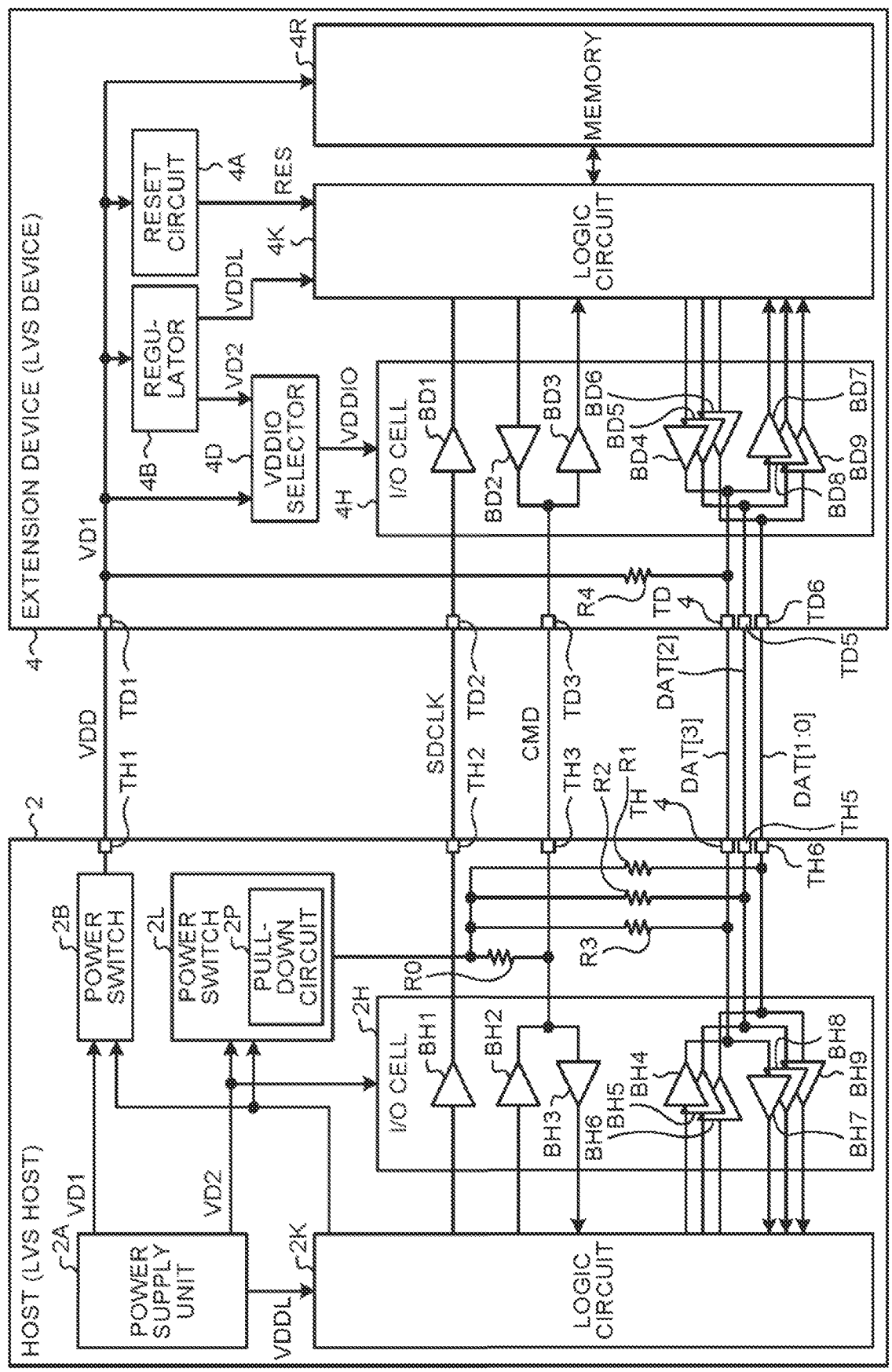
FIG. 2 is a block diagram illustrating a more detailed configuration of the LVS host and the LVS device illustrated in FIG. 1.

FIG. 2 is a block diagram illustrating a more detailed configuration of the LVS host and the LVS device illustrated in FIG. 1. FIG. 2 illustrates an example in which the extension device 4 illustrated in FIG. 1 is an SD card compatible with LVS.

Referring to FIG. 2, the host 2 includes a power supply unit 2A, power switches 2B (that may have a pull-down circuit but is not illustrated) and 2L, an I/O cell 2H, and a logic circuit 2K. The logic circuit 2K can include the clock generation unit 2E, the command control unit, 2F, the data control unit 2G, and the LVS control, unit a1 illustrated in FIG. 1, The host 2 also includes pull-up resistors R0 to R3, a power terminal TH1, a clock terminal TH2, a command terminal TH3, and data terminals TH4 to TH6.

The power terminal TH1 connects to the power line VDD. The clock terminal TH2 can be assigned the clock SDCLK. The command terminal TH3 can be assigned the command CMD and a response thereto. The data terminal TH4 can be assigned the data DAT[3]. The data terminal TH5 can be assigned the data DAT[2]. The data terminal TH6 can be assigned the data DAT[1:0]. The power switch 21 includes a pull-down circuit 2P. The I/O cell 2H includes output buffers BH1, BH2, and BH4 to BH6, and input buffers BH3 and BH7 to BH9.

The inputs of the output buffers BH11, BH2, and BH4 to BH6 and the outputs of the input buffers BH3 and BH7 to BH9 are connected to the logic circuit 2K. The output of the power switch 2B is connected to the power terminal TH1. The output of the output buffer BH1 is connected to the clock terminal TH2. The output of the output buffer BH2 and the input of the input buffer BH3 are connected to the command terminal TH3. The output of the output buffer BH4 and the input of the input buffer BH7 are connected to the data terminal TH4. The output of the output buffer BH5 and the input of the input buffer BH8 are connected to the data terminal TH5. The output of the output buffer BH6 and the input of the input buffer BH9 are connected to the data terminal TH6. The command terminal TH3 and the data terminals TH4 to TH6 are connected to the power switch 21 via the pull-up resistors R0 to R3, respectively.

The power switch 2L turns on and off the supply of the power-supply voltage VD2 as the cell power supply VDDIO to the I/O cell 2H. The power switches 2B and 2L can turn on and off the supply of the power-supply voltage according to control signals from the logic circuit 2K. The pull-down circuit 2P can pull down the potentials of the command terminal TH3 and the data terminals TH4 to TH6 to the ground potential via the pull-up resistors R0 to R3, respectively. The power supply unit 2A can supply the power-supply voltage VDDL to the logic circuit 2K. In the description of the data DAT[1:0] in the data terminal TH6, two signals are integrally shown. Specifically, there are the two output buffers BH6, the two input buffers BH9, and the two pull-up resistors R1, which are separately connected to the data DAT[1] and DAT[0].

The extension device 4 includes a reset circuit 4A, a regulator 4B, a VDDIO selector 4D, an I/O cell 4H, a logic circuit 4K, and a memory 4R. The logic circuit 4K can include the signal voltage control unit 4C, the clock reception unit 4K, the command control unit. 4E, the data control unit 4G, and the LVS control unit 41 illustrated in FIG. 1. The extension device 4 also includes a device detection resistor R4, a power terminal TD1, a clock terminal TD2, a command terminal TD3, and data terminals TD4 to TD6. The power terminal TD1 connects to the power line VDD. The clock terminal TD2 can be assigned the clock SDCLK. The command terminal TD3 can be assigned the command CMD and a response thereto. The data terminal TD4 can be assigned the data DAT[3]. The data terminal TD5 can be assigned the data DAT[2]. The data terminal TD6 can be assigned the data DAT[1:0]. The I/O cell 4H includes output buffers BD2 and BD4 to BD6, and input buffers BD1, BD3, and BD7 to BD9.

The inputs of the output buffers BD2 and BD9 to BD6 and the outputs of the input buffers BD1, BD3, and BD7 to BD9 are connected to the logic circuit 4K. The inputs of the reset circuit 4A, the regulator 4B, the VDDIO selector 4D, and the memory 4R are connected to the power terminal TD1. The input of the input buffer BD1 is connected to the clock terminal TD2. The output of the output buffer BD2 and the input of the input buffer BD3 are connected to the command terminal TD3.

The output of the output buffer BD4 and the input of the input buffer BD7 are connected to the data terminal TD4. The of of the output buffer BD5 and the input of the input buffer BD8 are connected to the data terminal TD5. The output of the output buffer BD6 and the input of the input buffer BD9 are connected to the data terminal TD6. The data terminal TD1 is connected to the power-supply voltage VD1 via the device detection resistor R4. The regulator 4B can supply the power-supply voltage VDDL to the logic circuit 4K. The reset circuit 4A can output the reset signal RES to the logic circuit. 4K. The memory 4R is connected to the logic circuit 4K.

Figure 3A:
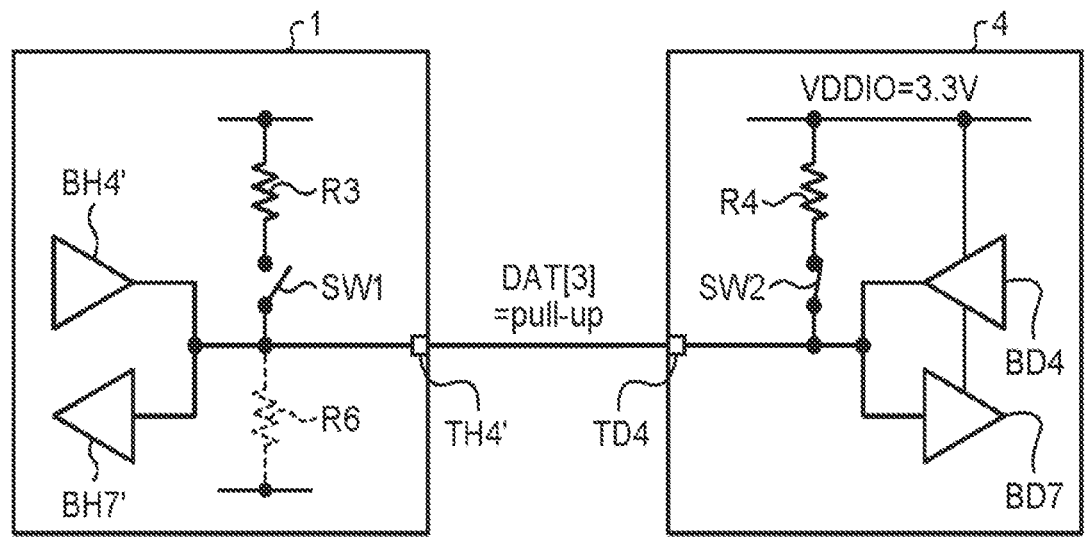
FIG. 3A is a block diagram illustrating the connection of a data line DAT[3] when the LVS device is attached to the HVS host illustrated in FIG. 1.
Figure 3B:
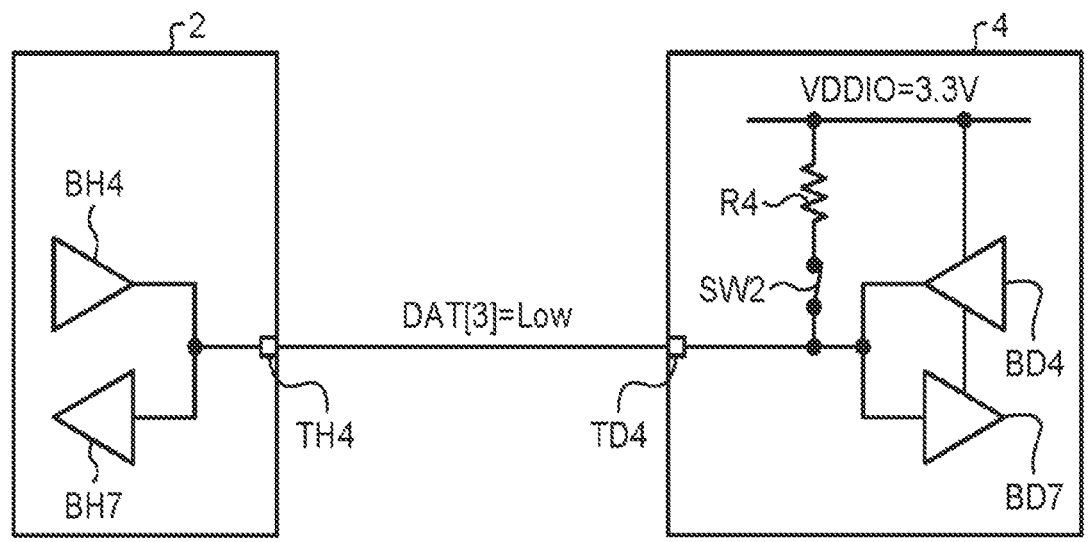
FIG. 3B is a block diagram illustrating the connection of the data line DAT[3] when the LVS device is attached to the LVS host illustrated in FIG. 1.

FIG. 3A is a block diagram illustrating the connection of the data line DAT[3] when the LVS device is attached to the HVS host illustrated in FIG. 1, and FIG. 3B is a block diagram illustrating the connection of the data line DAT[3] when the LVS device is attached to the LVS host illustrated in FIG. 1.

Referring to FIG. 3A, the extension device 4 includes the device detection resistor R4. An electrically controlled switch SW2 is connected in series to the device detection resistor R4 and can be disconnected from the DAT[3]. The resistance value of the device detection resistor R4 can be set to 10 to 90 k$\Omega$. The potential at one end of the device detection resistor R4 is connected to the I/O cell power supply VDDIO and supplied with 3.3 V as an initial value. Since the switch SW2 is in the on state, the voltage of the data DAT[3] is pulled up via the device detection resistor R4. At this time, the device detection resistor R4 can be used by the hosts 1 and 2 to recognize that the extension device 4 is attached to the hosts 1 and 2.

The host 1 of FIG. 1 includes an output buffer BH4', an input buffer BH7', and a data terminal TH4'. The output of the output buffer BH4' and the input of the input buffer BH7' are connected to the data terminal TH4'. The data terminal TH4' can be assigned the data DAT[3]. The data terminal TH4' is connected to the pull-up resistor R3 via a switch SW1. To conduct the device detection, the switch SW1 can be turned off to disconnect the pull-up resistor R3 from the DAT[3], thereby eliminating the influence on the device detection.

In addition, the data terminal TH4' is connected to the pull-down resistor R6. At this time, the resistance value is selected such that the voltage divided between the R4 and the R6 is at High level. That is, a high-value resistance satisfying R6»R4 can be employed as the resistance value of the pull-down resistor R6. The pull-down resistor R6 becomes necessary to perform the device detection and is intended to prevent the DAT[3] from entering the floating state when no device is connected. The connection of a device can be detected by a change in the voltage from Low to High levels.

When not detecting the extension device 4, the host 1 pulls up the data terminal TH4' via the pull-up resistor R3. When detecting the extension device 4, the host 1 disconnects the data terminal TH4' from the pull-up resistor R3. When the host 1 is not attached to the extension device 4, the host 1 pulls down the voltage of the data DAT[3] via the pull-down resistor R6, and the voltage of the data DAT[3] becomes Low. When the host 1 is attached to the extension device 4, the voltage of the data DAT[3] becomes a divided voltage that is divided between the device detection resistor R4 and the pull-down resistor R6. At this time, since R6»R4, the voltage of the data DAT[3] becomes High. Even though the switch SW1 is on and the pull-up resistor R3 is connected, the divided voltage between the resistors becomes High level and can be used to identify the HVS host.

Meanwhile, referring to FIG. 3B, it is assumed that the extension device 4 is attached to the host 2. The host 2 cannot receive a high voltage signaling of 3.3 V. Accordingly, in order to prevent the voltage of the data DAT[3] from being pulled up to as a high voltage as 3.3 V via the device detection resistor R4, the host 2 sets the voltage of the data DAT[3] to Low. At this time, the extension device 4 can monitor the voltage of the data DAT[3] to determine whether the LVS host or the HVS host is attached to the extension device 4. When determining the host 2 as an LVS host or an HVS host, the extension device 4 turns off the switch SW2 and disconnects the device detection resistor R4 from the data terminal TD4. Accordingly, it is possible to prevent a voltage of 3.3 V from being applied to the LVS host even when the LVS host stops the Low driving of the DAT[3].

Referring to FIGS. 3A and 3B, the switches SW1 and SW2 are formed from transistor switches, not mechanical switches. By setting the transistor to off, the device detection resistor R4 can be disconnected from the data terminal TD4.

Figure 4:
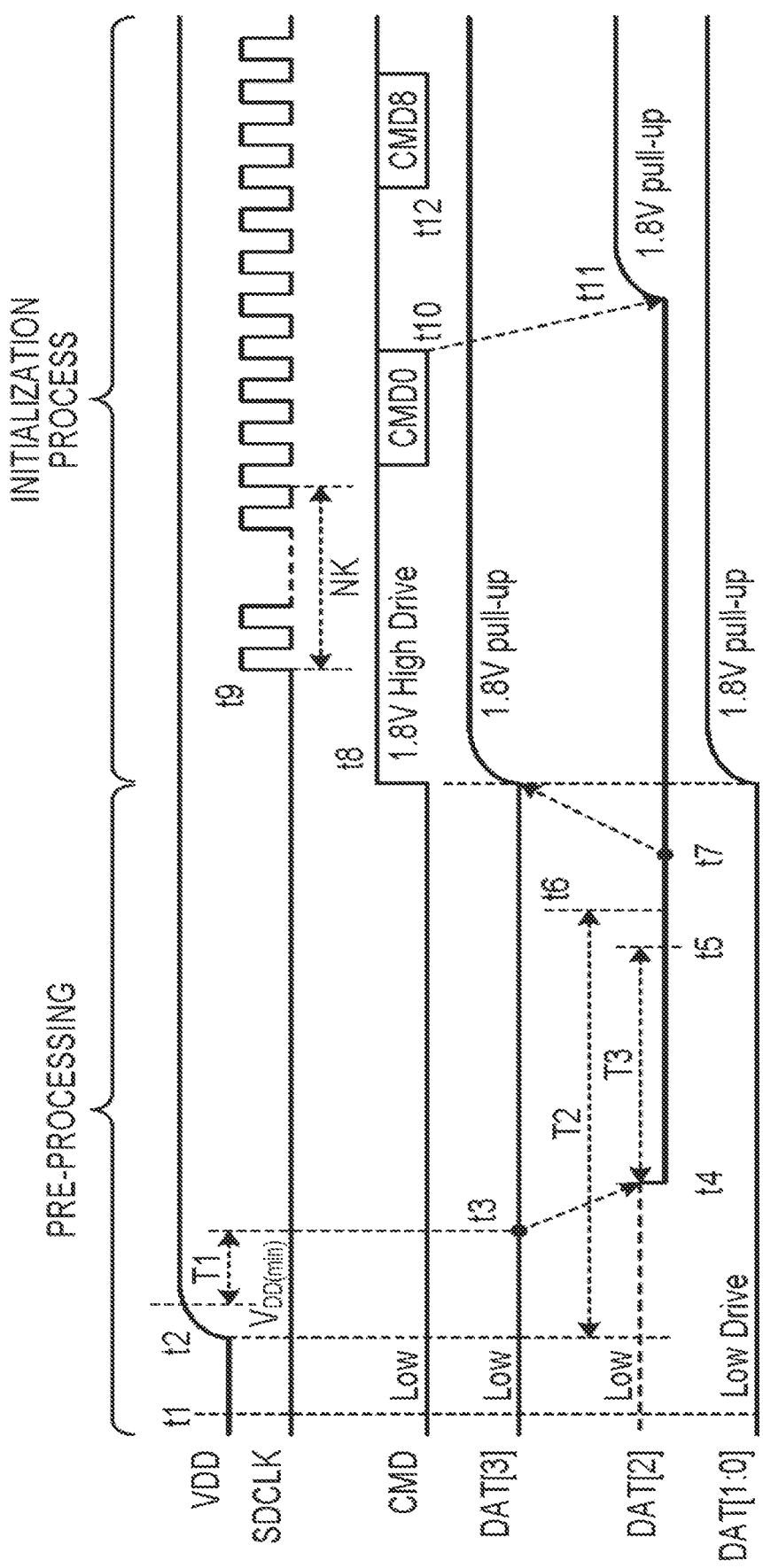
FIG. 4 is a timing chart of a pre-processing sequence when the LVS device is attached to the LVS host illustrated in FIG. 1.

FIG. 4 is a timing chart of a pre-processing sequence when the LVS device is attached to the LVS host illustrated in FIG. 1.

Referring to FIG. 4, before powering on the extension device 4 (t1), the host 2 sets all signals to Low. Since the clock SDCLK is not to be pulled up, the host 2 needs to drive the clock SDCLK (TH2) to Low by the output buffer BH1. In addition, as illustrated in FIG. 3B, the host 2 needs to drive the data DAT[3] (TTA) to Low by the output buffer BH4 in order to prevent the voltage of the data DAT[3] from being pulled up to as a high voltage as 3.3 V via the device detection resistor R4.

As for the other signals, that is, the command CMD (TH3) and the data DAT[2:0] (TD5 and TD6), the host 2 can set the voltages to Low by driving the signals to Low by the output buffers BH2, BH5, and BH6 or pulling down the signals by the pull-up resistors R0 to R2. The signals can be pulled down by the pull-down circuit 2P to fix the output of the power switch 2L to around 0 V. These operations are controlled by the logic circuit 2K.

When powering on the extension device 4 (t2), the host 2 turns on the power switch 2B by the power-supply voltage VD1 to supply the power-supply voltage VD1 to the extension device 4 via the power line VDD. First, since the power-supply voltage VD1 is supplied to the cell power supply VDDIO by the VDDIO selector 4D, the I/O cell 4H can be compatible with a high voltage signaling and resistant to a high voltage. When the power-supply voltage VD1 is supplied to the extension device 4, the reset circuit 4A outputs the reset signal RES to reset the logic circuit 4K.

When detecting the power-on by the reset circuit 4A, the extension device 4 checks the voltage after the data DAT[3] becomes stable (t3). Time t3 can be set to be later than passage of a predetermined period of time T1 since the power-supply voltage VD1 has reached a minimum value $V_{DD(min)}$ after the power-on. The extension device 4 determines the host 2 as an LVS host when the voltage of the data DAT[3] is Low, and the extension device 4 determines the host 2 as an HVS host when the voltage of the data DAT[3] is High. The voltage of the data DAT[3] may be checked more than once to prevent a detection error.

When detecting the host 2 as an LVS host, the extension device 4 drives the voltage of the data DAT[2] to Low (t4). When determining the host 2 as an LVS host, the extension device 4 can turn on the regulator 4B generating the power-supply voltage VD2 and disconnect the device detection resistor R4 from the data terminal TD4. When the output of the power-supply voltage VD2 from the regulator 4B becomes stable, the VDDIO selector 4D switches the cell power supply VDDIO from the power-supply voltage VD1 to the power-supply voltage VD2 (t5). At this time, the I/O cell 4H becomes compatible with a low voltage signaling of 1.8 V.

Next, on the host 2 side, the power switch 21 pulls up the data DAT[2] via the pull-up resistor R2 (t6). However, when having not driven the command CMD and the DAT[3] and DAT[1:0] to Low, the host 2 does not pull up the voltages of the command CMD and the data DAT[3] and DAT[1:0]. When the extension device 4 has driven the voltage of the data DAT[2] to Low, the voltage of the data DAT[2] is not pulled up but kept Low. The time t6 can be set to be later than the time t5. For example, the minimum value of a predetermined of time T2 can be set to −45 ms, and the maximum value of a predetermined period of time T3 can be set to 5 ms.

The host 2 checks the voltage of the data DAT[2] (t7). The voltage of the data DAT[2] may be checked more than once to prevent a detection error. When the voltage of the data DAT[2] is Low, the extension device 4 determines the host 2 as an LVS device and moves to the initialization process of the LVS device. In the initialization process, the host 2 can operate with a low voltage signaling of 1.8 V.

At this time, the host 2 pulls up the command CMD and the data DAT[3] and DAT[1:0] (t8). The host 2 may drive the command CMD to High as illustrated in the drawing. Next, the host 2 outputs the clock SDCLK (t9). Then, the host 2 outputs a predetermined number NK of clocks SDCLK and issues the command CMD0 (t10). The predetermined number NK can be set to 74 clocks, for example. Upon receipt of the command CMD0, the extension device 4 stops the Low driving of the voltage of the data DAT[2]. At time, the extension device 4 pulls up the voltage of the data DAT[2] (t11). Next, the host 2 issues the command CMD8 (t12). FIG. 4 does not illustrate the initialization process after the issuance of the command CMD8.

Figure 5:
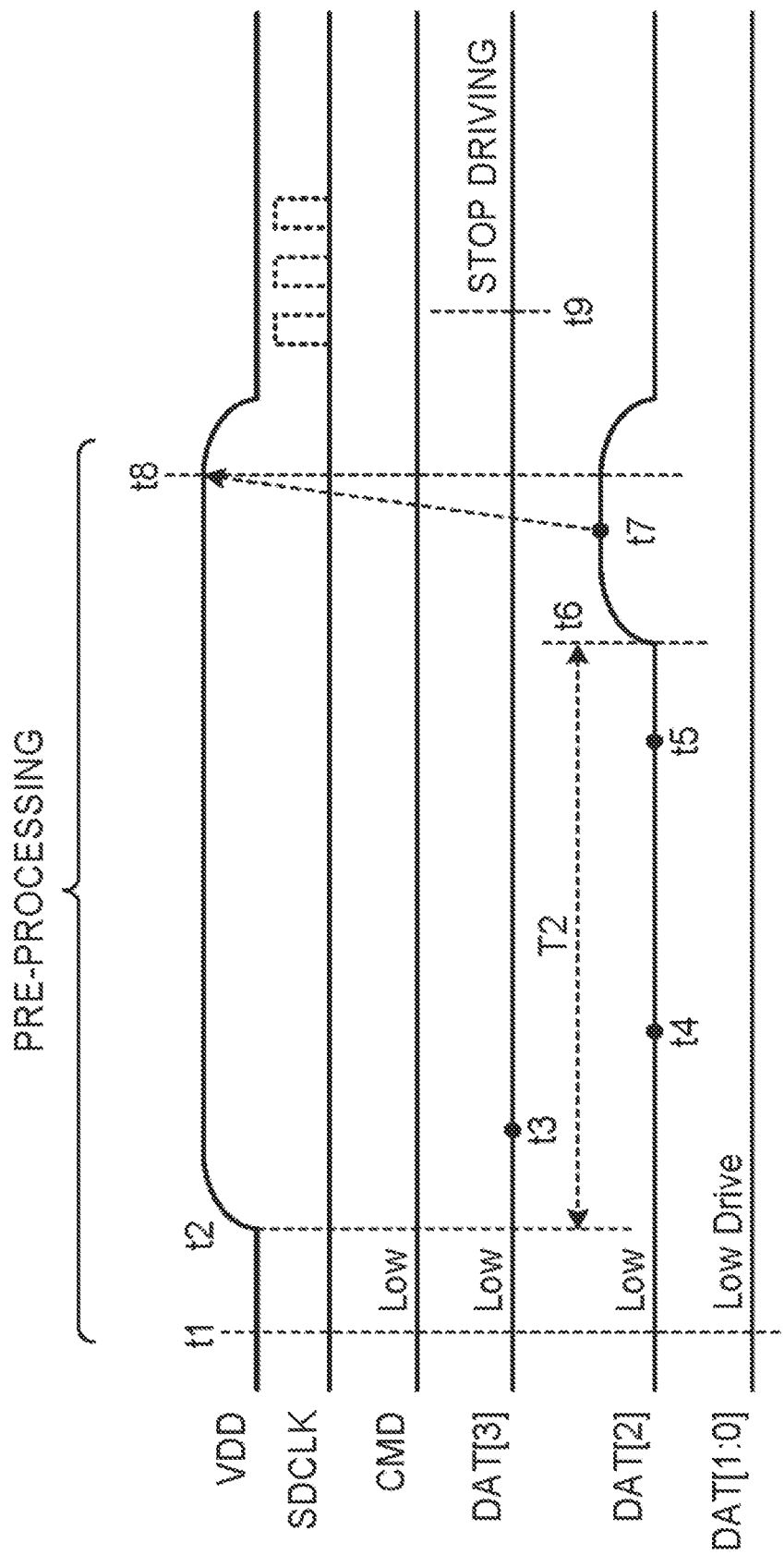
FIG. 5 is a timing chart of a pre-processing sequence when the HVS device is attached to the LVS host illustrated in FIG. 1.

FIG. 5 is a timing chart of a pre-processing sequence when the HVS device is attached to the LVS host illustrated in FIG. 1.

Referring to FIG. 5, before powering on the extension device 3 (t1), the host 2 sets all signals to Low. Since the clock SDCLK is not to be pulled up, the host 2 needs to drive the clock SDCLK (TH2) to Low by the output buffer BH1. In addition, as illustrated in FIG. 3B, the host 2 needs to drive the data DAT[3] (TD4) to Low by the output buffer BH4 in order to prevent the voltage of the data DAT[3] from being pulled up to as a high voltage as 3.3 V via the device detection resistor R4.

As for the other signals, that is, the command CMD (TH3) and the data DAT[2:0] (TD5 and TD6), the host 2 can set the voltages to Low by driving the signals to Low by the output buffers BH2, BH5, and BH6 or pulling down the signals by the pull-up resistors R0 to R2. The signals can be pulled down by the pull-down circuit 20 to fix the output of the power switch 21 to around 0 V. These operations are controlled by the logic circuit 2K.

When powering on the extension device 3 (t2), the host 2 supplies the power-supply voltage VD1 to the extension device 3 via the power line VDD. At this time, when the VDDIO selector 3D supplies V the power-supply voltage VD1 to the VDDIO of the I/O cell 3H, the extension device 3 can be compatible with a high voltage signaling of 3.3 V.

The host 2 sets the voltages of the command CMD and the data DAT[3:0] to Low to prevent the input of a middle voltage into the input buffer of the extension device 3 and prevent flowing of a flow-through current into the input buffer of the extension device 3. In addition, since the extension device 3 does not drive the command CMD and the data DAT[3:0], the host 2 can decide the voltages of the command CMD and the data DAT[3:0].

The extension device 3 detects the power-on but does not check the voltage of the data DAT[3] (t3). Accordingly, the extension device 3 does not determine whether the host 2 is an LVS host or an HVS host (t4).

Next, the power switch 21 of the host 2 pulls up the data DAT[2] via the pull-up resistor R2 (t6). At this time, since the extension device 3 does not drive the voltage of the data DAT[2] to Low, the voltage of the data DAT[2] rises to High. In order to prevent the generation of a flow-through current, the host 2 needs to control the command CMD and the data DAT[1:0] so as not to become High at the time of pull-up.

The host 2 checks the voltage of the data DAT[2] (t7). The voltage of the data DAT[2] may be checked more than once to prevent a detection error. When the voltage of the data DAT[2] is High, the host 2 determines the extension device 3 as an HVS device. Then, the host 2 sets the output of the power switch 21 to 0 V to stop the pull-up of the data DAT[2], and turns off the power switch 2B to stop the supply of the power-supply voltage to the extension device 3 (t8). Further, the host 2 stops the driving of the voltage of the data DAT[3] (t9) and rejects the extension device 3.

Figure 6A:
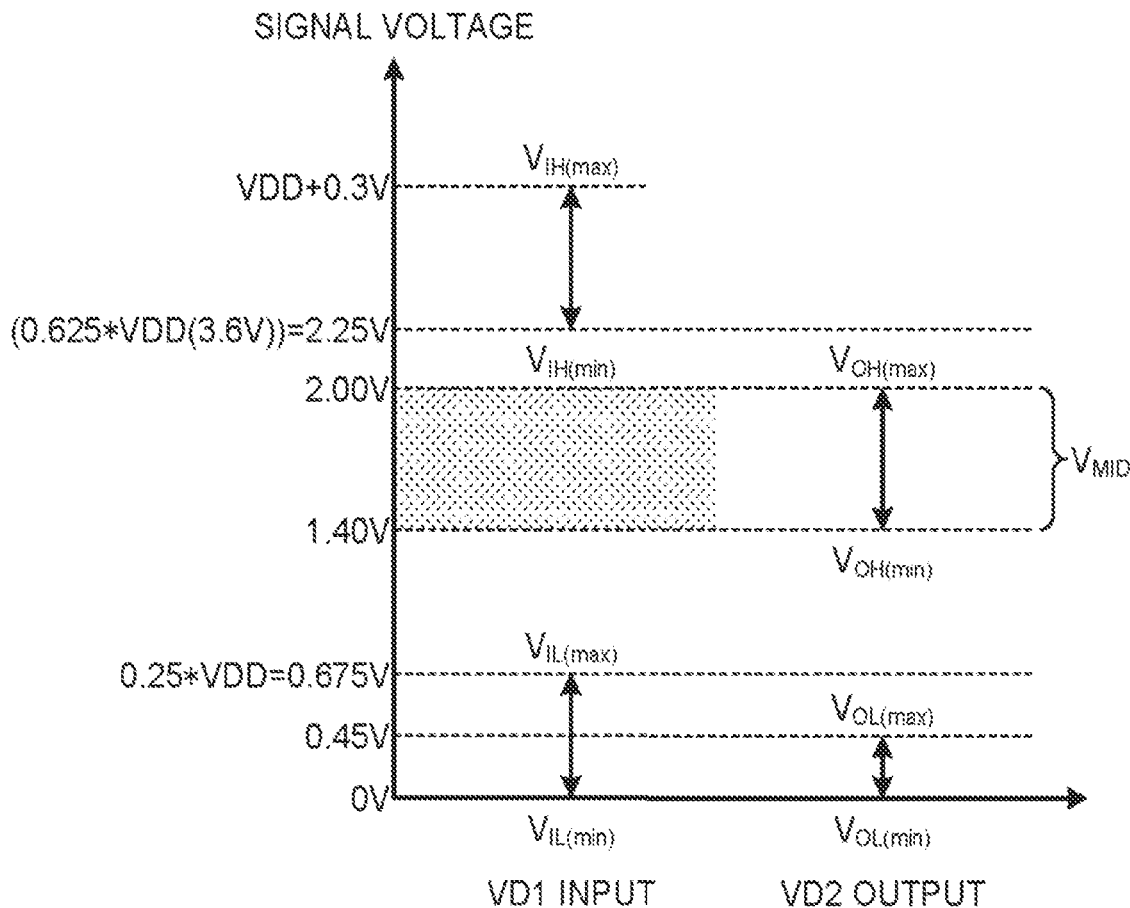
FIG. 6A is a diagram illustrating that a High level of low-voltage signaling output becomes a middle voltage of high voltage signaling input.
Figure 6B:
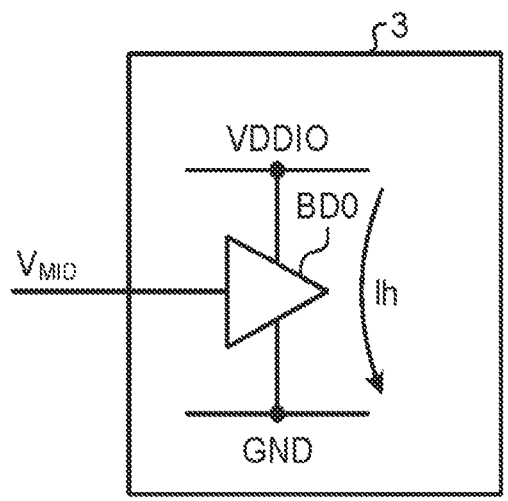
FIG. 6B is a block diagram illustrating the state in which a flow-through current occurs when the middle voltage is input into the HVS device illustrated in FIG. 1.

FIG. 6A is a diagram illustrating that a High level of low-voltage signaling output becomes a middle voltage of high voltage signaling input, and FIG. 6B is a block diagram illustrating the state in which a flow-through current occurs when the middle voltage is input into the HVS device illustrated in FIG. 1. FIG. 6A illustrates the case in which the VDD is equivalent to the power-supply voltage VD1 and takes on the maximum value 3.6 V of the power-supply voltage VD1.

Referring to FIG. 6A, in the high voltage signaling input, the High range of signal voltage is set between a maximum value $V_{IH(max)}$ (=VDD+0.3 V) and a minimum value $V_{IH(min)}$(=2.25 V), and the Low range of signal voltage is set between a maximum value $V_{IL(max)}$(=0.675 V) and a minimum value $V_{IL(min)}$(=0 V). In the low voltage signaling output, the High range of signal voltage is set between a maximum value $V_{OH(max)}$(=2.00 V) and a minimum value $V_{OH(min)}$(=1.40 V), and the Low range of signal voltage is set between a maximum value $V_{OL(max)}$(=0.45 V) and a minimum value $V_{OL(min)}$(=0 V).

Accordingly, in the case with a combination of the high voltage signaling input and the low voltage signaling output, a High level of low voltage signaling output becomes a middle potential $V_{MID}$ with respect to the high voltage signaling input buffer.

At this time, as illustrated in FIG. 6B, it is assumed that the extension device 3 includes the input buffer BD0. When the input buffer BD0 operates with a high voltage signaling, the host 2 applies a High level of low voltage signaling output to the input buffer BD0, the middle potential $V_{MID}$ is applied to increase the possibility, that a flow-through current Ih flows into the input buffer BD0 (depending on the implementation and conditions).

In this example, as illustrated in FIG. 5, the host 2 can identify the kind of the card by the voltage of the data DAT[2] and determine the extension device 3 as an HVS device when the voltage of the data DAT[2] is High. To this end, the host 2 needs to apply the middle voltage. In order to minimize the time during which the middle current is applied, when determining the extension device 3 as an HVS device, the host 2 desirably controls and minimizes the time between the instant when the data DAT[2] is pulled up and the instant when the supply of the power-supply voltage is stopped. This makes it possible to ignore the influence of the flow-through current Ih flowing into the input buffer BD0 for a short time.

The initialization process after the pre-processing of the host 2 and the extension device 4 will be described below in detail. The initialization process can complement the detection of the host and the extension device in the pre-processing. In the initialization process, the command CMD8 and a response to the same are used. In the detection of the voltages of the data DAT[2] and DAT[3] in the pre-processing, the probability of false detection resulting from the operating environments of the host and the extension device, the damage and age deterioration of the host and the extension device, and others is quite low but not zero.

In addition, some error may occur while the host and the extension device communicate with each other between the reception of the command CMD8 and the supply of the power, and the communication needs to be stopped for safety in the event of an error. The occurrence of the error can be notified to the host by not returning the command CMD8 or a response to the same.

FIG. 7 is a diagram illustrating the contents of the CMD8 in an LVS SD card transmitted by the host according to the first embodiment.

Referring to FIG. 7, the field VHS of the conventional CMD8 defines the command argument 0001b indicating that the high power-supply voltage is 3.3 V. At the same time, the field defines that high voltage signaling is used. Accordingly, the field VHS=0001b of the new CMD8 can define that the high power-supply voltage is 3.3 V and high voltage signaling is used. In addition, the field VHS of the CMD8 compatible with LVS can define a command argument 00010b indicating that the high power-supply voltage is 3.3 V and low voltage signaling is used to indicate under which of the signal voltages the host is operating.

In the case where the extension device 4 illustrated in FIG. 1 is an LVS card, upon receipt of the CMD0 from the host 2, the extension device 4 can identify the command argument VHS=0010b, copy the content of the command argument 00010b to a response, and returns the response to the CMD8 to the host 2 unless any other error has occurred. Upon receipt of the response to the CMD0 from the extension device 4, the host 2 can recognize that the extension device 4 is an LVS card and no error has occurred.

Meanwhile, in the case where the extension device 3 illustrated in FIG. 1 conforms to the UHS-I standards, upon receipt of the CMD8 from the host 2, the extension device 3 cannot identify the command argument 00010b and returns no response to the CMD8 to the host 2. Accordingly, the host 2 can recognize that the extension device. 3 is not an LVS card and reject the extension device 3.

In addition, different check patterns may be set depending on whether the signal voltage is 1.8 V or 3.3 V.

Figure 8:
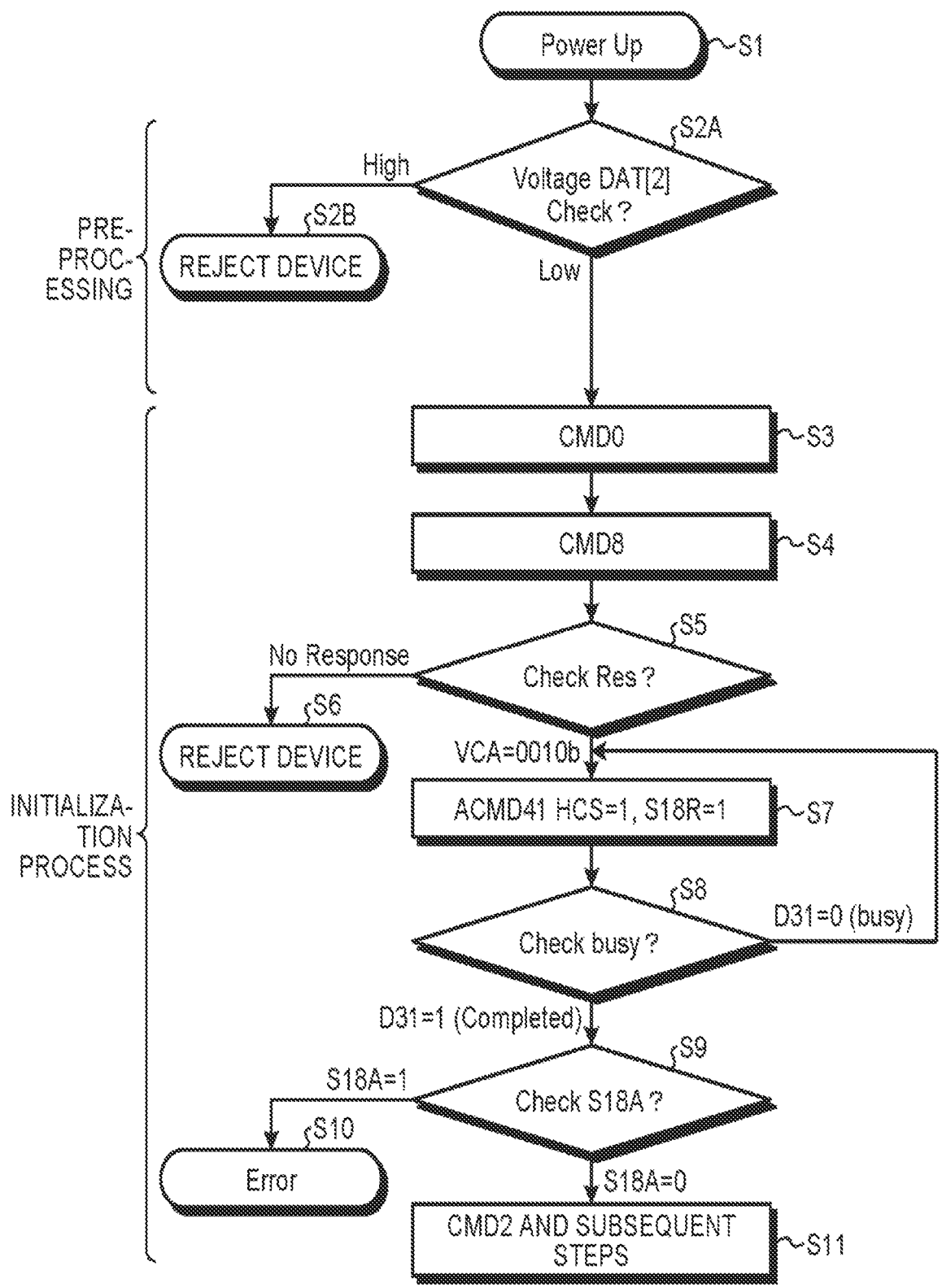
FIG. 8 is a flowchart of a pre-processing and initialization sequence of the host according to the first embodiment.

FIG. 8 is a flowchart of a pre-processing and initialization sequence of the host according to the first embodiment. FIG. 8 describes command issuance and response reception as a set. However, the CMD0 is an exceptional command to which no response is returned.

Referring to FIG. 8, the host 2 executes the pre-processing before the initialization process. In the pre-processing, step S1 of powering on the device corresponds to the time t2 illustrated in FIGS. 4 and 5. Step S2A corresponds to the time t7 illustrated in FIGS. 4 and 5. When the voltage of the data DAT[2] is High, the host 2 determines the device as an HVS device, stops the driving of the HVS device, and rejects the HVS device (S2B). Step S2B corresponds to the time t8 illustrated in FIG. 5.

Meanwhile, when the voltage of the data DAT[2] is Low, the host 2 determines the device as an LVS device, and moves to the initialization process of the LVS device. In the initialization process, the host 2 issues the command CMD0 (S3). Step S3 corresponds to the time t10 illustrated in FIG. 4. At this time, a signal voltage of 1.8 V is used for the clock CLK and the command CMD. Next, the host 2 sets the command argument 00010b to the field VHS of the CMD8, and issues the comma CMD8 (S4). Step S4 corresponds to the time t12 illustrated in FIG. 4.

Next, the host 2 checks the response to the issuance of the command CMD8 (S5). In this example, the LVS device can return a response in which the field VCA compatible with VHS is set to 0010*b*. When there is no response from the LVS device, the host 2 rejects the LVS device (S6). Meanwhile, when VCA=00010b in the response to the issuance of the command CMD8, the host 2 issues an initialization command ACMD41 (S7). At this time, the host 2 sets the argument of the initialization command ACMD41 to S18R=1 indicating that a low voltage signaling is used. Then, the host 2 refers to a field D31 in a response to the initialization command. ACMD41 to determine whether the LVS device is in the busy state (S8).

When the LVS device is not in the busy state, the host 2 checks a bit S18A included in the response to the ACMD41 (S9). When D31=1, the host 2 can exit from the loop at S8. Meanwhile, D31=0 remains set at S8 and the loop of S7 and S8 is repeated, a timer installed in the host 2 detects, a timeout and the host 2 determines that an error has occurred.

The host 2 checks the bit S18A included in the response to ACMD41 (S9). When the NS device has switched the signal level to a low voltage signaling, S18A=0 is surely set in the response and a voltage switch sequence (CMD11) is skipped. Then, the issuance of the command CMD2 and the subsequent steps are executed (S11). When the check on S18A reveals that S18A=1, the host 2 determines that an error has occurred (S10) and stops the process.

Figure 9:
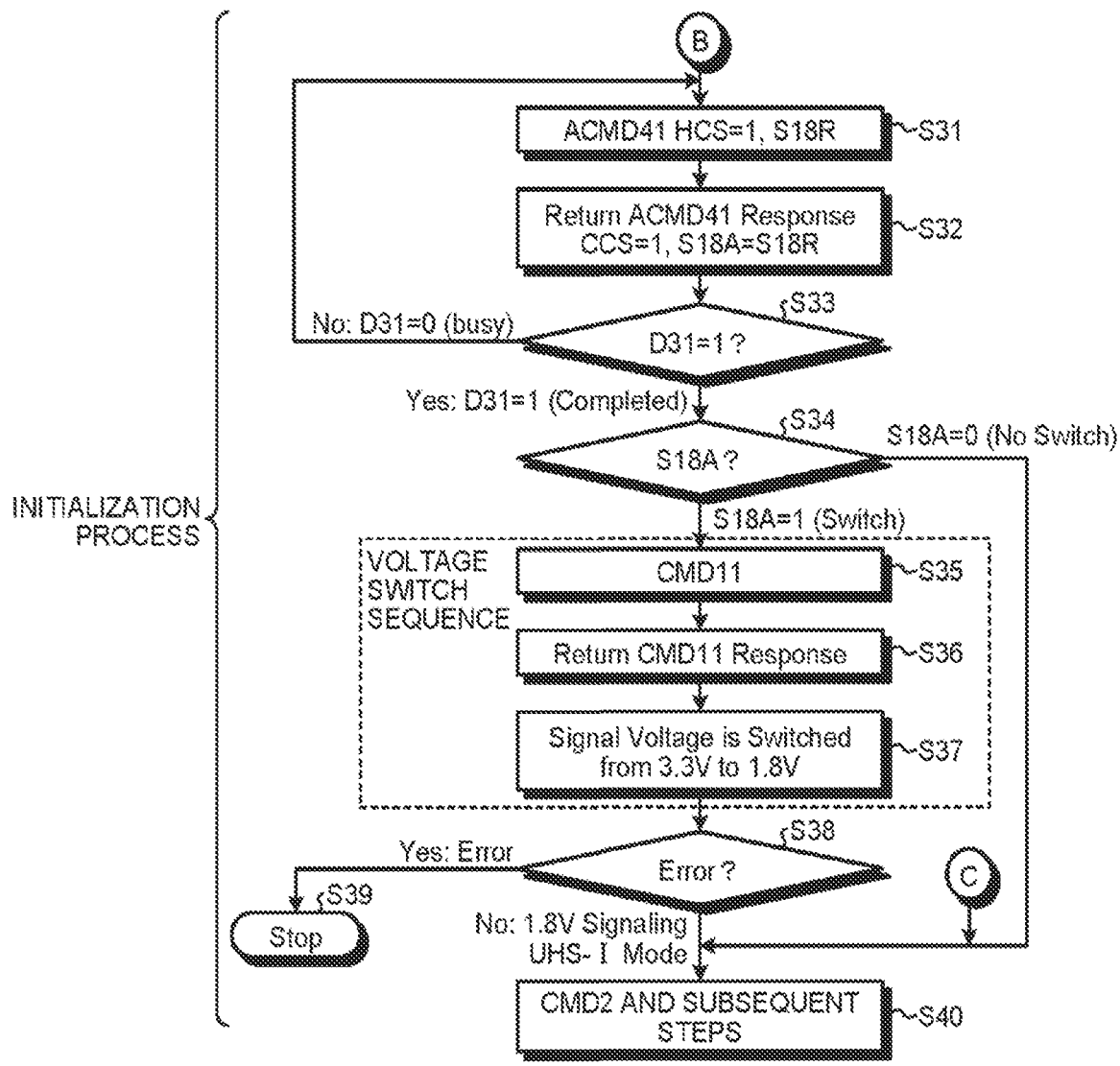
FIG. 9 is a flowchart of a pre-processing and initialization sequence of the extension device according to the first embodiment.
Figure 10:
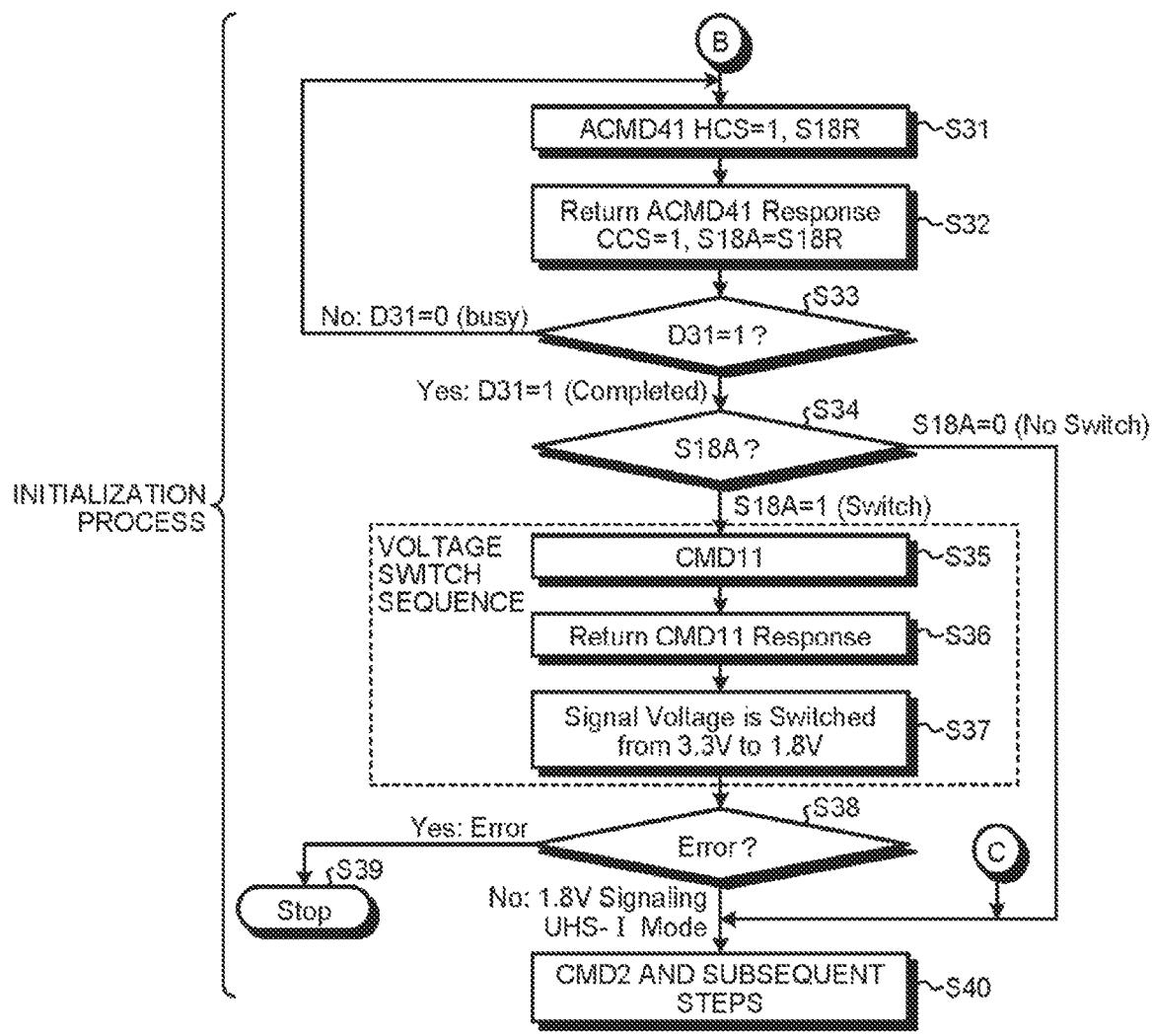
FIG. 10 is a flowchart of an initialization sequence of the extension device according to the first embodiment.

FIGS. 9 and 10 are a flowchart of a pre-processing and initialization sequence of the extension device according to the first embodiment. FIG. 10 describes only the receipt of commands after the CMD2 and does not describe the issuance of responses.

Referring to FIG. 9, the extension device 4 executes the pre-processing before the initialization process.

In the pre-processing, when being powered on (S21), the extension device 4 checks the voltage of the data DAT[3] (S22A). Step S21 corresponds to the time t2 illustrated in FIG. 4. Step S22A corresponds to the time t3 illustrated in FIG. 4. The extension device 4 determines the host an LVS host when the voltage of the data DAT[3] is Low, the extension device 4 determines the host as an HVS host when the voltage of the data DAT[3] is High.

When determining the host as an LVS host, the extension device 4 turns on the regulator 4B for 1.8 V, disconnects the device detection resistor R4, and switches the cell power supply VDDIO to the power-supply voltage VD2 after the power-supply voltage VD2 becomes stable, and then switches the I/O cell to low voltage signaling (S22B). When determining the host as an HVS host, the power-supply voltage VD1 is already connected to the cell power supply VDDIO, and the extension device 4 keeps the state. Upon completion of the pre-processing, the extension device 4 moves to the initialization process.

In the initialization process, upon receipt of the command CMD0 from the hosts 1 and 2, the extension device 4 performs a reset operation (S23). Next, upon receipt of the command CMD8 from the hosts 1 and 2 (S24), the extension device 4 checks the field VHS (S25). When the command argument 0001b or 00010b is not set in the field VHS, the extension device 4 returns no response (S26). Meanwhile, when the command argument 0001b is set in the field VHS, the extension device 4 returns a response of high voltage signaling of VCA=VHS to the hosts 1 and 2. When there is no error and the command argument 00010b is set, the extension device 4 returns a response of low voltage signaling of VCA=VHS to the hosts (S27 and S27'). FIG. 9 describes the sequence of VHS=00010b subsequent from S27 (FIG. 7).

Next, upon receipt of the command ACMD41, the extension device 4 checks whether S18R=1 (S28). Then, the extension device 4 sets S18A=0 and returns a response to the command ACMD41 to the host (S29). When the execution of the ACMD41 is completed, the extension device 4 returns a response of D31=1, and when the execution is continued, the extension device 4 returns a response of D31=0 (S30). The value of S18A becomes effective when D31=1. When executing the initialization command by a low voltage signaling, the extension device 4 needs to return a response of S18A=0. Accordingly, the extension device 4 skips the voltage switch sequence (CMD11), and executes steps subsequent from the issuance of the command CMD2 (S40) as described in FIG. 10.

Meanwhile, when the command argument 0001b is set in the field VHS at S25, the extension device 4 returns a response of a high voltage signaling to the CMD8. After that, when the hosts 1 and 2 issue the command ACMD41 (S31) as described in FIG. 10, the extension device 4 returns a response of S18A=S18R to the hosts 1 and 2 (S32) because the extension device 4 is assumed to support UHS-I. Next, the extension device 4 determines whether D3=1 (S33). When D31=0, the extension device 4 returns to S31 to repeat steps S31 to S33. The value of S18A becomes effective when D31=1.

Meanwhile, when D31=1, upon completion of the execution of the ACMD41, the operation of the extension device 4 varies depending on the value returned to the S18A (S34). When S18A=0 is returned, the extension device 4 is to receive the next command at step 240, and needs to skip the voltage switch sequence. When receiving the CMD11, the extension device 4 determines the occurrence of error.

Meanwhile, when returning S18A=1, the extension device 4 moves to the voltage switch sequence. In the voltage switch sequence, upon receipt of the command CMD11 from the host 1 (S35), the extension device 4 returns a response to the command CMD11 (S36), and switches the signal voltage from 3.3 V to 1.8 V (S37). Next, the extension device 4 conducts error determination (S38). When any error has occurred, the extension device 4 stops the process (S39), and when no error has occurred, the extension device 4 has succeeded in switching to the low voltage signaling, and moves to S40.

Second Embodiment

In some HVS hosts, the initial levels of the signals are not unified but the data DAT[3] may be set to Low. Accordingly, the detection of the LVS host cannot be reliably done only by one level check. According to a second embodiment, in the pre-processing before issuance of a command, the signal is checked two or more times at different timings to allow reliable mutual detection of the LVS device and the LVS host.

Figure 11:
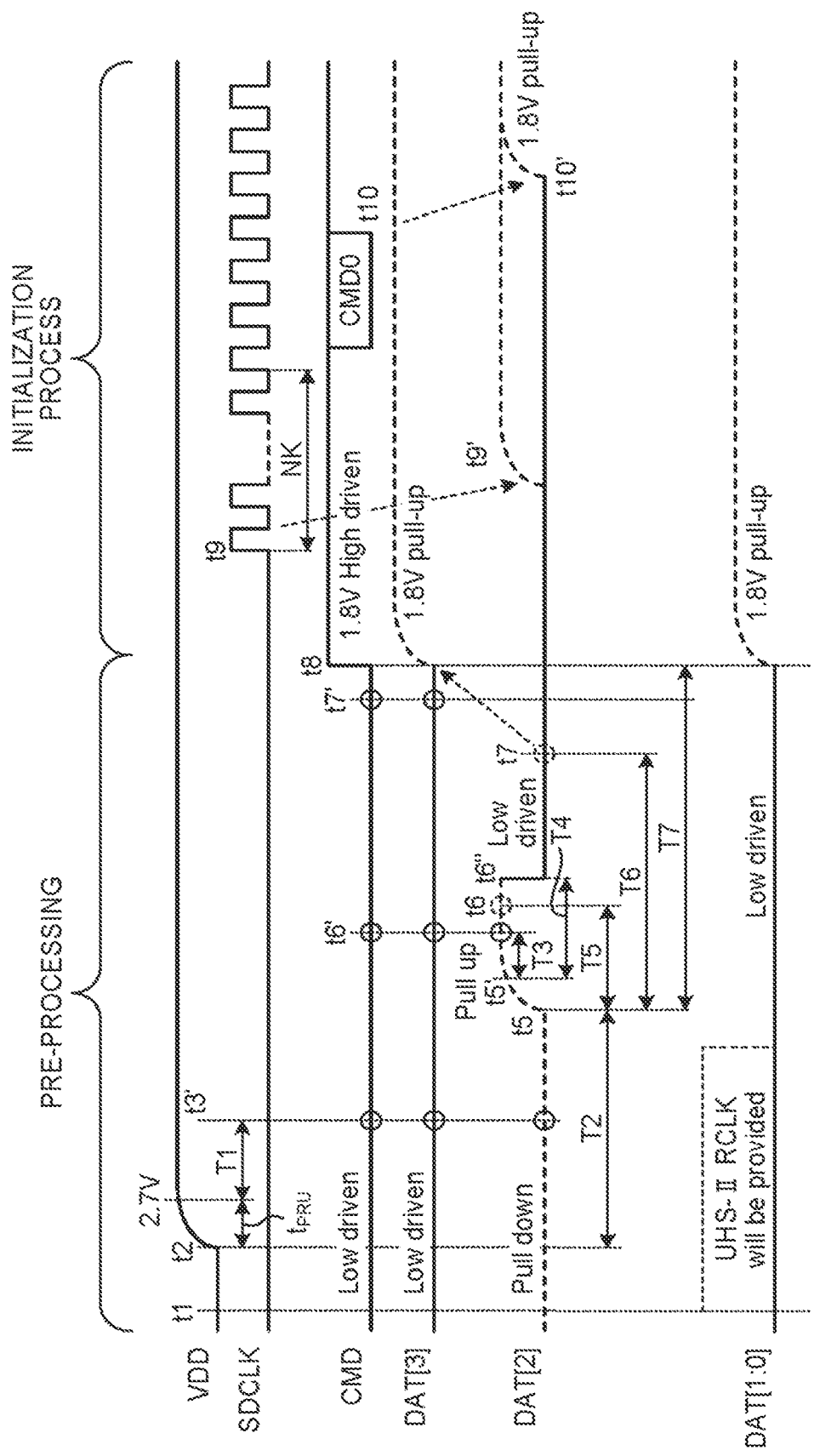
FIG. 11 is a timing chart of a pre-processing sequence when an LVB device is attached to an LVS host according to a second embodiment.

FIG. 11 is a timing chart of a pre-processing sequence when the LVS device is attached to the LVS host according to the second embodiment. Referring to FIG. 11, times t1, t2, and t5 to t10 are timings managed by the host 2, and times t3', t5', t6', t6", t7', and t10' are timings managed by the extension device 4. The Low or High-driven signals are shown by solid lines, and the pulled-down or pulled-up signals are shown by dotted lines. However, for the duration in which. High driving continues because the signals are not used, the signals may be pulled up.

When there is a conflict between Low driving or High driving and pulling-down or pulling-up, a higher priority of voltage level is given to Low driving or High driving than pulling-down or pulling-up. The solid circles represent points checked by the extension device 4, and the dotted circles are points checked by the host. Each circle is checked more than once to prevent false detection due to noise or the like. For example, each point is checked three consecutive times whether the same level is maintained.

Before powering on the extension device 4 (t1), the host 2 pulls down only the data DAT[2], and drives the others, that is, the clock CLK, the command CMD, and the data DAT[3] to Low. The host 2 supporting UHS-II needs to supply the clock to the data DAT[1:0] to attempt the initialization in the UHS-II mode. When the initialization in the UHS-II mode cannot be implemented, the host 2 drives the data DAT[1:0] to Low by no later than the time t5. When powering on the extension device 4 (t2), the host 2 turns on the power switch 2B by the power-supply voltage VD1 to supply the power-supply voltage VD1 to the extension device 4 via the power line VDD. First, since the power-supply voltage VD1 is supplied to the cell power supply VDDIO by the VDDIO selector 4D, the I/O cell 4H can be compatible with a high voltage signaling and resistant to a high voltage.

When a rise time $t_{PRU}$ has passed from the power-on (t2), the reset circuit 4A outputs the reset signal RES to reset the logic circuit 4K. The rise time $p_{PRU}$ can be defined within a wide time range from 0.1 to 35 ms depending on the power supply design of the host 2. The extension device 4 can detect the rise time by a voltage detection circuit or the like. The voltage level of the power line VDD after passage of the rise time $t_{PRU}$ can be set to 2.7 V, for example. The host 2 can predict the rise time $t_{PRU}$ from the characteristics of its power supply circuit. When being reset by the logic circuit 4K, the extension device 4 can stop the operation.

When a predetermined period of time T1 has passed after the extension device 4 detected the rise time $t_{PRU}$, the extension device 4 is released from the resetting by the logic circuit 4K. Then, the extension device 4 checks the voltage levels of the command CMD and the data DAT[2] and DAT[3] (this will be called first check step) (t3'). The predetermined period of time T1 can be set to the period of time until the voltage levels of the command CND and the data DAT[2] and DAT[3] become stable. By resetting the extension device 4 by the logic circuit 4K until the predetermined period of time T1 has passed after the extension device 4 detected the rise time $t_{PRU}$, it is possible to check the voltage levels of the command CMD and the data DAT[2] and DAT[3] after they become stable, thereby preventing false detection.

When a predetermined period of time T2 has passed from the power-on (t2), the host 2 pulls up the data DAT[2] and shifts the voltage level of the data DAT[2] to High (t5). The predetermined period of time T2 can be set to be equal to or more than $t_{PRU}$+1 ms. Then, when a predetermined period of time T5 has passed from the starting of pull-up of the data DAT[2] (t5), the host 2 checks the voltage level of the data DAT[2] (t6).

The predetermined period of time T5 can be set to be the period of time until the voltage level of the data DAT[2] becomes stable. The host 2 can predict the predetermined period of time T5 from t5 to t6 by the value of the pull-up resistor P2 included in the host 2, but the predetermined period of time T5 may be set to a sufficiently larger value than the rise time determined by the maximum pull-up resistance and the maximum load capacity, for example, 10 to 15 μs.

Meanwhile, when a preterminal period of time T3 has passed from the detection of the rise of the voltage level of the data DAT[2] (t5'), the extension device 4 checks the voltage levels of the command CMD and the data DAT[2] and DAT[3] (this step will be hereinafter called second check step) (t6').

The extension device 4 executes the second check step when all the voltage levels of the command CMD and the data DAT[2] and DAT[3] are Low at the first check step. The predetermined period of time T3 can be set to the period of time until the voltage level of the data DAT[2] becomes stable. When none of the voltage levels of the command CMD and the data DAT[2] and DAT[3] are Low at the first check step, the extension device 4 determines the host as an HVS host and does not need to execute the second check step.

The extension device 4 determines the host 2 as an LVS host when the voltage levels of the command CMD and the DAT[3] are Low and the voltage level of the data DAT[2] is High at the second check step. The extension device 4 determines the host 2 as an HVS host in the other situations. When detecting the host 2 as an LVS host, the extension device 4 drives the voltage of the data DAT[2] to Low (t6"). A predetermined period of time T4 from the detection of the rise of the voltage level of the data DAT[2] (t5') to the driving of the voltage of the data DAT[2] to Low can be set to 20 μs or more, for example. This is because the predetermined period of time T5 is assumed to be 10 to 15 μs.

When detecting the host 2 as an LVS host, the extension device 4 can turn on the regulator 4B generating the power-supply voltage VD2 and disconnect the device detection resistor R4 from the data terminal TD4. When the output of the power-supply voltage VD2 from the regulator 4B becomes stable, the VDDIO selector 4D switches the cell power supply VDDIO from the power-supply voltage VD1 to the power-supply voltage VD2. At this time, the I/O cell 4H becomes compatible with a low voltage signaling of 1.8 V.

Next, the host 2 checks the voltage level of the data DAT[2] (t7). The host 2 determines the extension device 4 as an LVS device when the voltage level of the data DAT[2] is High at the time t6 and the voltage level of the data DAT[2] is Low at the time t7. A predetermined period of time 16 from the starting of the pull-up of the data DAT[2] (t5) to the checking of the voltage level of the data DAT[2] (t7) can be set to 100 µs or more, for example.

When determining the extension device 4 as an LVS device, the host 2 pulls up the command CKD and the data DAT[3] and DAT[1:0] (t8). As illustrated in the drawing, the host 2 may drive the command CMD to High. Then, the host 2 shifts to the initialization process of the LVS device. In the initialization process, the host 2 can operate under a low voltage signaling of 1.8 V. The host 2 also outputs the clock SDCLK (1:9). When receiving the clock SDCLK, the extension device 4 stops the Low driving of the voltage of the data DAT[2]. At this time, the host 2 pulls up the voltage of the data DAT[2] (t9').

Next, the host 2 outputs a predetermined number of clocks SDCLK, and issues the command CMD0 (t10). The predetermined number can be set to 74 clocks, for example. When receiving the command. CMD0, the extension device 4 may stop the Low driving of the data DAT[2]. At this time, the host 2 pulls up the voltage of the data DAT[2] (t10').

Since the rise time (t5 to t6) of the data DAT[2] varies depending on the value of the pull-up resistor R2, the extension device 4 can determine the times t6' and t6" with reference to time t5' when the rise of the data DAT[2] was detected. This prevents false detection due to variations n the value of the pull-up resistor R2. The time when the LVS device detected a transition from Low to High of 1.8 V by a voltage detect on circuit or the like is t6'. The voltage detection circuit can detect signal voltages of 1.8 V or more for both a high signal voltage and a low signal voltage.

When recognizing the LVS host at the time t6', the extension device 4 needs to switch the I/O cell 4H by no later than the time t8 for a transition from a high voltage signaling to a low voltage signaling. A set period of time T7 from the time t5 to the time t8 can be set to 5 ms or more. This makes it possible to discharge a smoothing condenser charged with 3.3 V included in the power circuit and turn on the regulator 4B to ensure the period of time until the 1.8 V power becomes stable. Disconnecting the device detection resistor R4 during this period of time prevents a voltage of 3.3 V from being applied to the LVS host. To improve the reliability of identification of the LVS host, the extension device 4 may check additionally whether the clock SDCLK=Low at the times t3' and t6'.

The extension device 4 can recognize the host 2 as an LVS host when all the voltage levels of the command CMD and the data DAT[2] and DAT[3] are detected as Low at the first check step and the voltage levels of the command CMD and the DAT[3] are detected as Low and the voltage level of the data DAT[2] is detected as high at the second check step. At this time, the HVS host does not operate irregularly so as to pull-up only the data DAT[2] to High and drive the other signals to Low. Accordingly, even though the HVS host may set the data DAT[3] to Low, it is possible to differentiate between the HVS host and the LVS host to identify the LVS host in a reliable manner.

The host 2 can determine the extension device 4 as an LVS device when the voltage level of the data DAT[2] is High at the time t6 and the voltage level of the data DAT[2] is Low at the time t7. This prevents false detection due to short-circuit and disconnection of a transmission path or the like.

In the foregoing description, the extension device 4 determines the host 2 as an LVS host when the voltage levels of the command. CMD and the DAT[9] are Low and the voltage level of the data DAT[2] is High at the second check step, and determines the host 2 as an HVS host in the other situations. To improve the reliability of identification of the LVS host, the extension device 4 may additionally perform a third check step (t7'). At the third check step, the extension device 4 checks the voltage levels of the command CMD and the DAT[3] immediately before the host 2 pulls up the command CMD and the data DAT[3] and DAT[1:0]. Then, the extension device 4 can determine the host 2 as an LVS host when the voltage levels of the command CMD and the DAT[3] are Low, and can determine the host 2 as an HVS host in the other situations.

Figure 12:
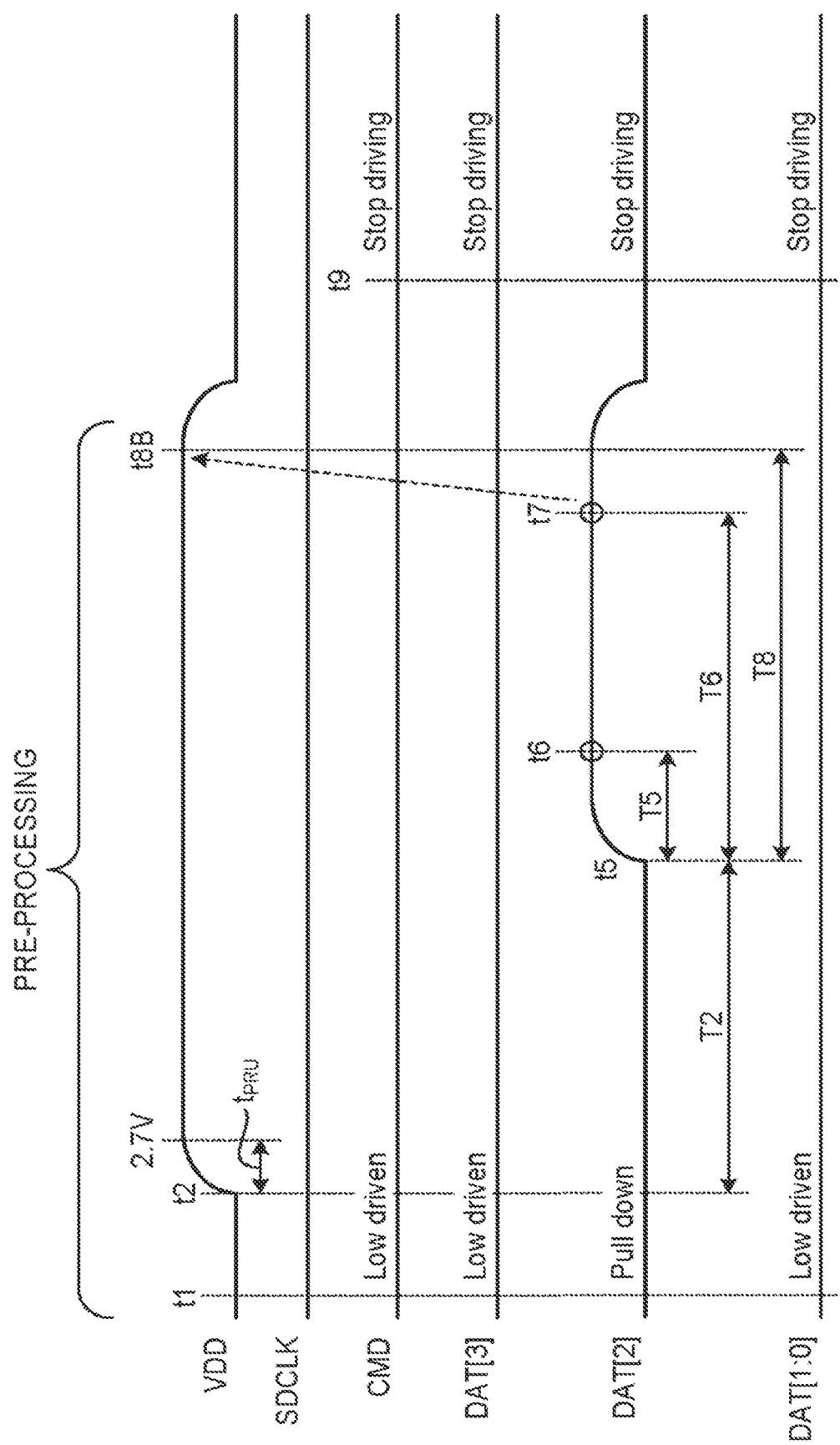
FIG. 12 is a timing chart of a pre-processing sequence when an HVS device is attached to the LVS host according to the second embodiment.

FIG. 12 is a timing chart of a pre-processing sequence when an HVS device is attached to the LVS host according to the second embodiment.

Referring to FIG. 12, the operations from the time t1 to the time t5 are the same as described in FIG. 5. After that, the power switch 21 of the host 2 pulls up the data DAT[2] via the pull-up resistor R2 (t5). At this time, since the extension device 3 does not drive the data DAT[2] to Low, the voltage of the data DAT[2] rises to High, To prevent the occurrence of a flow-through current, the host 2 needs to control the command am and the data DAT[1:0] so as not to become High due to the pull-up.

After checking the voltage level of the data DAT[2] (t6), the host 2 checks again the voltage level of the data DAT[2] (t7), Then, the host 2 determines the extension device 3 as an HVS device when the voltage level of the data DAT[2] is High at the time t6 and the voltage level of the data DAT[2] is High at the time t7. The host 2 turns the output of the power switch 21, to 0 V to stop the pull-up of the data DAT[2], and turns off the power switch 2B to stop supply of the power-supply voltage to the extension device 3 (t8B). Further, the host 2 stops the driving of the voltages of the command CMD and the data DAT[3] (t0) and rejects the extension device 3. At this time, to reduce a flow-through current, a set period of time T8 from the starting of the pull-up of the data DAT[2] (t5) to the stoppage of the power-supply voltage to the extension device 3 (t8B) can be set to 200 µs or less.

Figure 13:
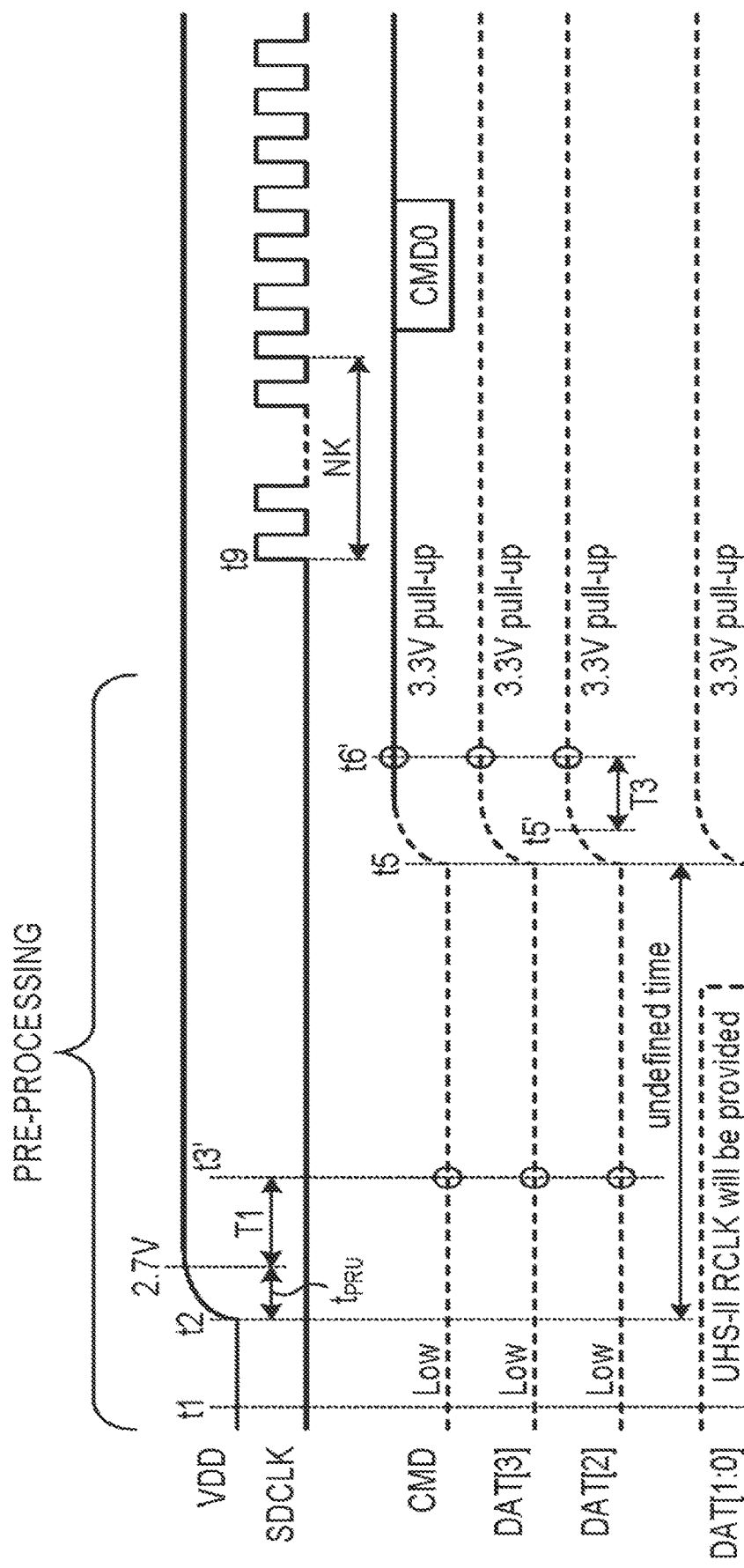
FIG. 13 is a timing chart of a pre-processing sequence when the LVS device is attached to an HVS host according to the second embodiment.

FIG. 13 is a timing chart of a pre-processing sequence when the LVS device is attached to an HVS host according to the second embodiment.

Referring to FIG. 13, the operations from the time t1 to the time t0 are the same as described in FIG. 11. After that, when the predetermined period of time T3 has passed from the detection of the voltage level of the data DAT[2] (t5'), the extension device 4 checks the voltage levels of the command CMD and the data DAT[2] and DAT[3] (t6'). The extension device 4 determines the host 2 as an HVS host when the voltage levels of the command CMD and DAT[3] are not Low. At this time, the HVS host pulls up the command CMD the data DAT[2:0] by the pull-up resistor. The data DAT[3] is pulled up by the device detection resistor R4 even though the pull-up resistor of the host is connected at the same time.

Figure 14:
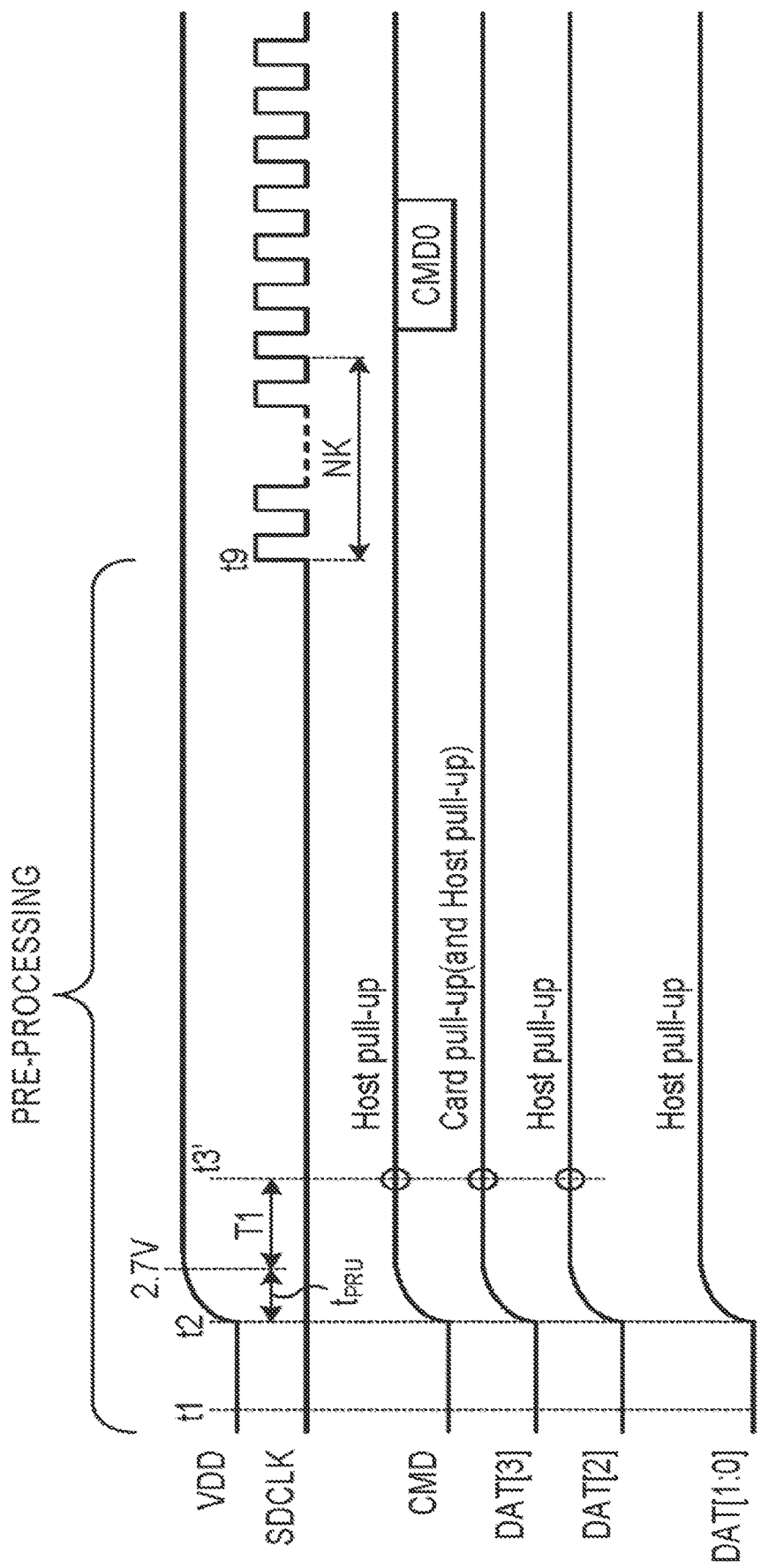
FIG. 14 is a timing chart of another example of a pre-processing sequence when the LVS device is attached to the HVS host according to the second embodiment.

FIG. 14 is a timing chart of another example of a pre-processing sequence when the LVS device is attached to the HVS host according to the second embodiment.

Referring to FIG. 14, the HVS host sets all the signals to Low before powering on the extension device 4 (t1). When powering on the extension device 4 (t2), the HVS host pulls up the command CML and the data DAT[3], DAT[2], and DAT[1:0]. The data DAT[3] is also pulled up by the extension device 4. After that, the extension device 4 checks the voltage levels of the command. CMD and the data DAT[2] and DAT[3] (t3'). The extension device 4 determines the host as an HVS host when any one of the voltage levels of the command CMD and the data DAT[2] and DAT[3] is High.

The HVS host is an existing host and various activation sequences for it are possible. First, since the LVS device operates with a high voltage signaling, a low voltage signaling operation is allowed only in the case where the sequence described in FIG. 11 is satisfied, and a high voltage signaling operation is performed in the other cases. That is, the operations described in FIGS. 12 to 14 are mere three examples of operations that do not apply to the sequence described in FIG. 11, and other sequences of high voltage operations exist.

For example, as for the detection of an illegal operation in the case of FIG. 11, the HVS host may have a clock detection circuit to detect the clock SD CLI during the times t3' to t9, or may have a voltage detection circuit to detect whether the voltage level of the command CMD becomes High during the times t3' to t8, or may detect whether the voltages of the command CMD and the clock SDCLK are higher than the maximum High value of the low voltage signaling during the times t8 to t9.

Third Embodiment

Figure 15:
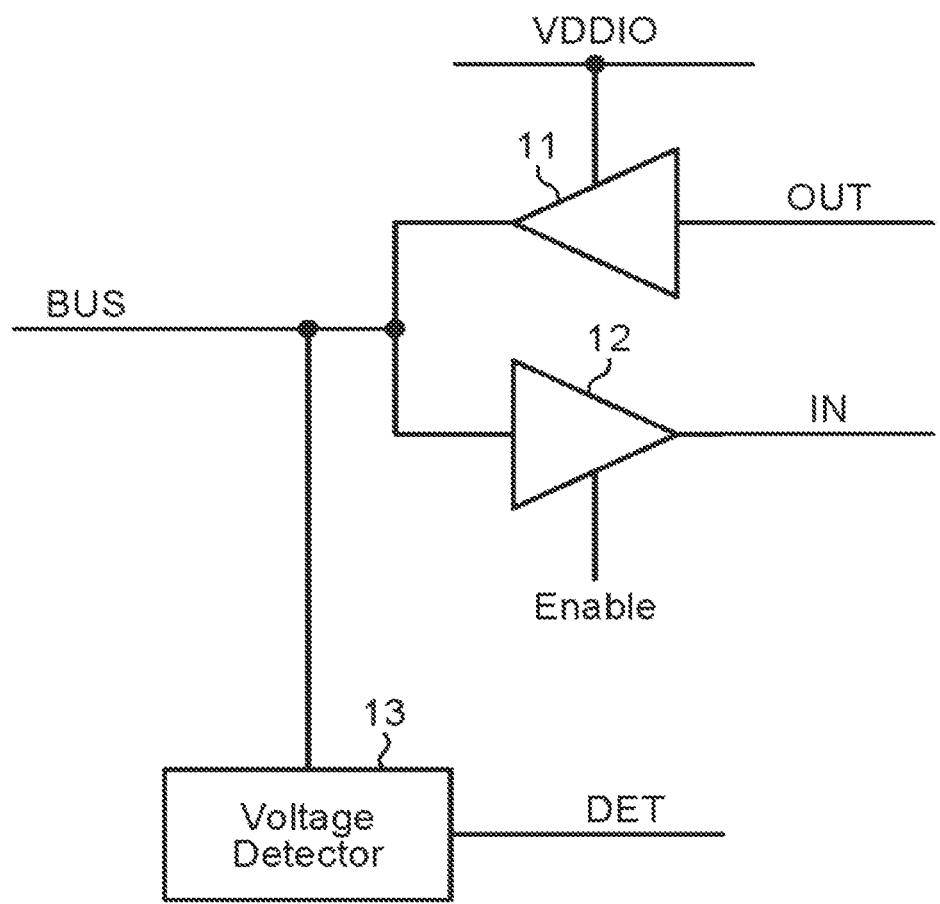
FIG. 15 is a block diagram illustrating a configuration example of input/output buffers for use in an LVS device according to a third embodiment.

FIG. 15 is a block diagram illustrating a configuration example of input/output buffers for use in an LVS device according to a third embodiment. In the third embodiment, inputs into the input I/O cell of the data DAT[2] can be disabled to prevent a flow-through current.

Referring to FIG. 15, the LVS device includes an output buffer 11, an input buffer 12, and a voltage detection circuit 13, instead of the output buffer BD2 and the input buffer BD3 of the extension device 4 illustrated in FIG. 2. An output signal OUT is input from the logic circuit 4K into the output buffer 11, and a bus interface signal BUS is output from the output buffer 11. The bus interface signal BUS is the data DAT[2]. An enable control signal Enable is input into the input buffer 12. In the enabled state, the bus interface signal BUS is transferred as an input signal IN to the logic circuit 4K. In the disabled state, no flow-through current is generated even when the bus interface signal BUS enters in the floating state or the middle voltage level.

The voltage detection circuit 13 determines whether the voltage level of the bus interface signal BUS is above or under a threshold, and outputs a determination result DET. Since the bus interface signal BUS is input into the voltage detection circuit 13, the voltage detection circuit 13 can determine the voltage level of the bus interface signal BUS even when the input buffer 12 is disabled. With the configuration illustrated in FIG. 15, it is possible to prevent a High voltage from flowing through even though it is applied from the time t5 described in FIG. 11. The configuration illustrated in FIG. 15 is also applicable to the bus interface signal BUS other than the data DAT[2].

In the second embodiment, the signal voltages of the command CMD and the data DAT[3:2] are used in combination for determination. The determination can be made with at least two signals. The functions of the signals can be exchanged and the signal names are not limited. The signals can be freely combined.

Fourth Embodiment

Figure 16A:
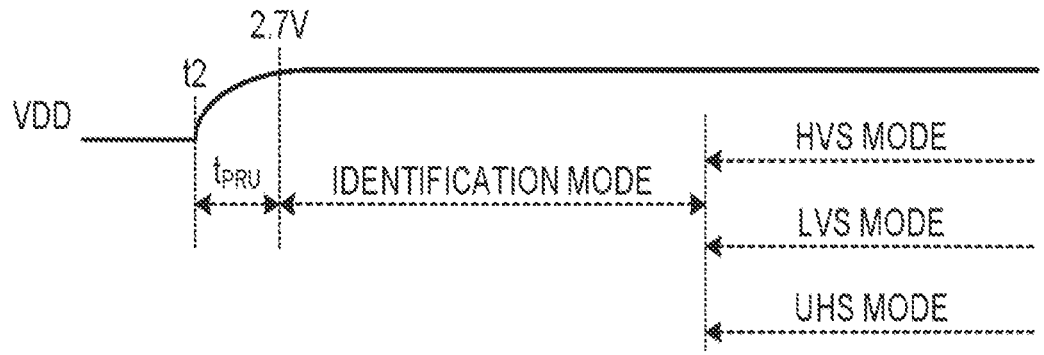
FIG. 16A is a timing chart describing a period of LVS identification mode according to a fourth embodiment.
Figure 16B:
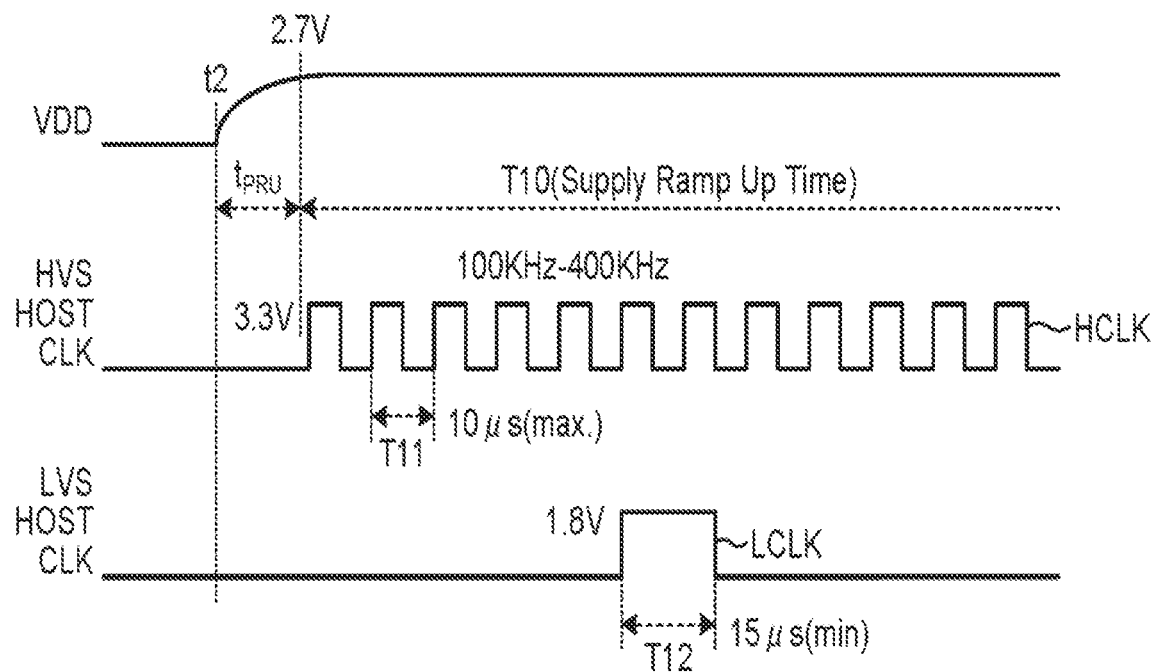
FIG. 16B is a timing chart of a clock supplied by the HVS host at the time of initialization and a clock issued by the HVS host in an LVS identification sequence.

FIG. 16A is a timing chart describing a period of LVS identification mode according to a fourth embodiment and FIG. 16B is a timing chart describing an example of an LVS identification sequence described in FIG. 16A.

Referring to FIG. 16A, after passage of the rise time $t_{PRU}$ from the power-on (t2), the extension device 4 moves to the LVS identification mode. The extension device 4 identifies operations in which of HVS mode, LVS mode, and UHS-II mode according to the procedure of signals during the period of time in the LVS identification mode. Then, according to the mode, the extension device 4 selects the power supply VDDIO, the input threshold, and the output signal voltage level of the I/O cell. In the LVS identification mode, the extension device 4 selects the input threshold corresponding to the low voltage signaling (1.8 V) to receive the clocks CLK of high voltage signaling (3.3 V) and low voltage signaling (1.8 V).

As illustrated in FIG. 16B, a clock HCLK may be input from the HVS host at a period of ramp-up time T10 from the power-on (t2) to the rise. The amplification of the clock HCLK from the HVS host is 3.3 V and the frequency band of the same is 100 to 400 KHz. When the frequency is 100 KHZ, a cycle T11 becomes 10 µs that is the maximum. In the LVS identification mode, the LVS host outputs one clock pulse of low voltage signaling (1.8 V).

By setting a High pulse width T12 of a clock LCLK to 15 µs or more, the clock LCLK can be differentiated from the clock HCLK. For example, the clock can be determined as the clock HCLK when the High pulse width is 10 µs or less allowing for a margin, and the clock can be determined as the clock LCLK when the High pulse width is 10 µs or more. The High pulse width of the T12 can be arbitrarily set but needs to be longer than at least the High pulse width of the clock HCLK.

The LVS card can recognize that the HVS host is connected when receiving two or more clocks, or receiving a clock with a small pulse width of less than 10 µs, or receiving a clock with an amplitude of 2 V or more in the LVS identification mode. When recognizing the HVS host, the LVS card sets the power supply VDDIO of the I/O cell to 3.3 V and sets the input threshold value to 3.3 V to enter the HVS mode. When recognizing the LVS host, the LVS card sets the power supply VDDIO of the I/O cell to 1.8 V and sets the input threshold to 1.8 V to enter the LVS mode.

Accordingly, even when the HVS host outputs the clock HCLK immediately after the power-on, the LVS card can differentiate between the HVS host and the LVS host.

Fifth Embodiment

Figure 17:
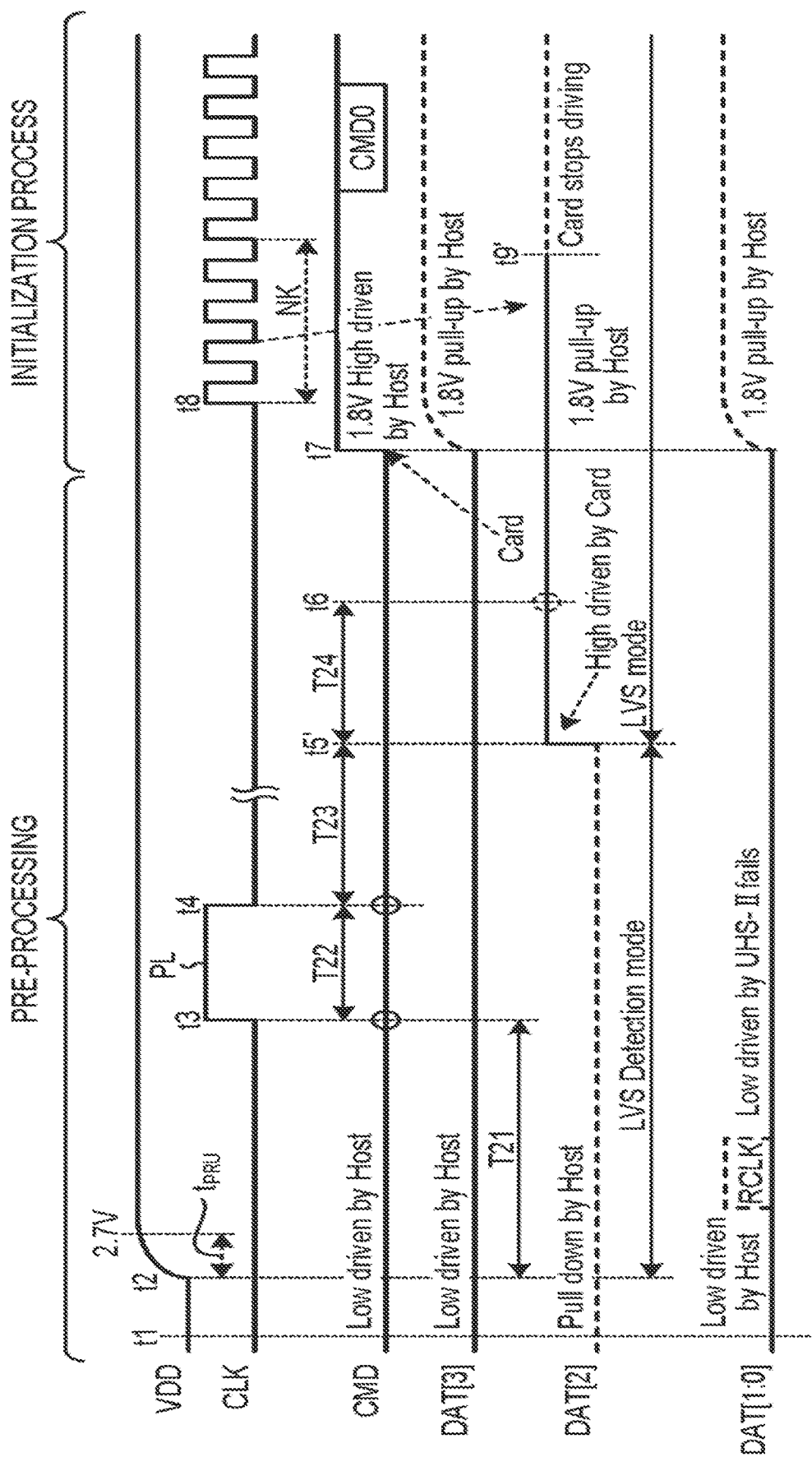
FIG. 17 is a timing chart describing an LVS identification sequence when an LVS device is attached to an LVS host according to a fifth embodiment.

FIG. 17 is a timing chart describing an LVS identification sequence when an LVS device is attached to an LVS host according to a fifth embodiment.

Referring to FIG. 17, reference signs t1 to t8 represent timings managed by the host 2, and t5' and t9' represent timings managed by the extension device 4. The signals not driven but pulled up are shown by dotted lines, and the other signals are shown by solid lines. When there is a conflict between Low driving or High driving and pulling-down or pulling-up, a higher priority of voltage level is given to Low driving or High driving than pulling-down or pulling-up.

The solid circles represent points checked by the extension device 4, and the dotted circles are points checked by the host 2.

Before powering on the extension device 4 (t1), the host 2 pulls down only the data DAT[2], and drives the others, that is, the clock CLK, the command CMD, and the data DAT[3] and DAT[1:0] to Low. In particular, the Low driving of the DAT[3] prevents the DAT[3] from being pulled up by a card detection resistor attached to the extension device.

When driving the data DAT[2] to Low, the host 2 needs no pull-down resistor. When pulling down the data DAT[2], the host 2 needs a pull-down resistor. When the host 2 powers on the extension device 4 (t2), the power-supply voltage VD1 of the host 2 turns on the power switch 2B to supply the power-supply voltage VD1 to the extension device 4 via the power line VDD. First, since the Power-supply voltage VD1 is supplied to the cell power source VDDIO by the VDDIO selector 4D, the I/O cell 4H can be compatible with a high voltage signaling (except CLK) and resistant to a high voltage.

When the rise time $t_{PRU}$ has passed from the power-on (t2), The reset circuit 4A outputs the reset signal RES to reset the logic circuit 4K. The host 2 supporting UHS-II tries to use UHS-II. At this time, the host 2 may supply the clock to the data DAT[1:0] to try the initialization in the UHS-II mode. When the in initialization in the UHS-II mode cannot be performed, the host 2 drives the data DAT[1:0] to Low by no later than the time t3, and moves to the LVS identification sequence.

In the case where the UHS-II initialization is not to be performed, after at least a predetermined period of time has passed from the power-on (t2), the host 2 transmits one clock pulse PL as the clock CLK to the extension device 4 (t3 to t4) to start the LVS identification sequence. The predetermined period of time T21 can be set to $t_{PRU}+1$ ms or more, for example. A pulse width T22 of the one clock pulse PL can be set to 15 μs or more. For example, since the minimum frequency of the clock supplied by the host 1 is 100 KHz, the minimum value of the pulse width 122 may be set to 15 μs allowing for a margin when the clock is identified with a width of High.

Accordingly, the extension device 4 can determine the host as host 1 when the width of High is smaller than 10 μs, and can determine the host as host 2 when the width of High is longer than 10 μs. Since the amplitude of the one clock pulse PL corresponds to a low voltage signaling (1.8 V), the extension device 4 needs to be capable of receiving both a high voltage signaling and a low voltage signaling. This is all by setting the threshold voltage of the clock input buffer BD1 to a low voltage signaling.

The extension device 4 checks the voltage level of the command CMD at the timing of reception of the one clock pulse PL. When the voltage level of the command CMD is Low or the pulse width T22 of the one clock pulse PL is 10 μs or more, the extension device 4 recognizes the host 2 as an LVS host. Satisfying the both conditions makes the recognition more reliable.

When the preparation for The operation with a low voltage signaling (1.8 V) is prepared, the extension device 4 disconnects the device detection resistor R4 by not later than the time t5'. A period of time T23 from the time t4 to the time t5' can be set to 5 ms or less as a period of time during which the regulator generating power of 3.3 V to 1.8 V is stable, for example. When recognizing that the connected host is an LVS host (host 2) and LVS mode is ready, the extension device 4 drives the data DAT[2] to High the level by t5'.

Upon passage of a predetermined period of time T23+124 from the time t4 (t6), the host 2 checks the voltage level of the data DAT[2] after passage of more than 5 μs. When the voltage level of the data DAT[2] is High, the host 2 recognizes the extension device 4 as an LVS device.

When determining the extension device 4 as an LVS device, the host 2 pulls up the command CMD and the data DAT[3:0] by the low voltage signaling (t7). The host 2 may drive the command CMD to High under a low voltage signaling as illustrated in the drawing. Then, the host 2 moves to the initialization process of the LVS device. In the initialization process, the host 2 can operate under a low voltage signaling of 1.8 V. In addition, the host 2 outputs the clock SDCLK (t8). Upon receipt of the clock CLK, the extension device 4 stops the driving of the data DAT[2]. The host 2 pulls up the voltage of the data DAT[2] (t7). Next, when outputting a predetermined number of clocks CLK, the host issues the command CMD0 and starts the initialization of the extension device.

At the timing of receipt of the one clock pulse PL, the extension device 4 checks at least the voltage level of the command CMD (Any of DAT[3:0] level Low may be checked as well), and the host 2 can decide the timing for the check. This eliminates the need to determine the timing for checking the voltage level of the command CMD by time, thereby to facilitate the device design. In addition, since the host 2 decides the timing for checking the voltage level of the command CMD, it is possible to eliminate the data unstable period and simplify the standards.

Figure 18:
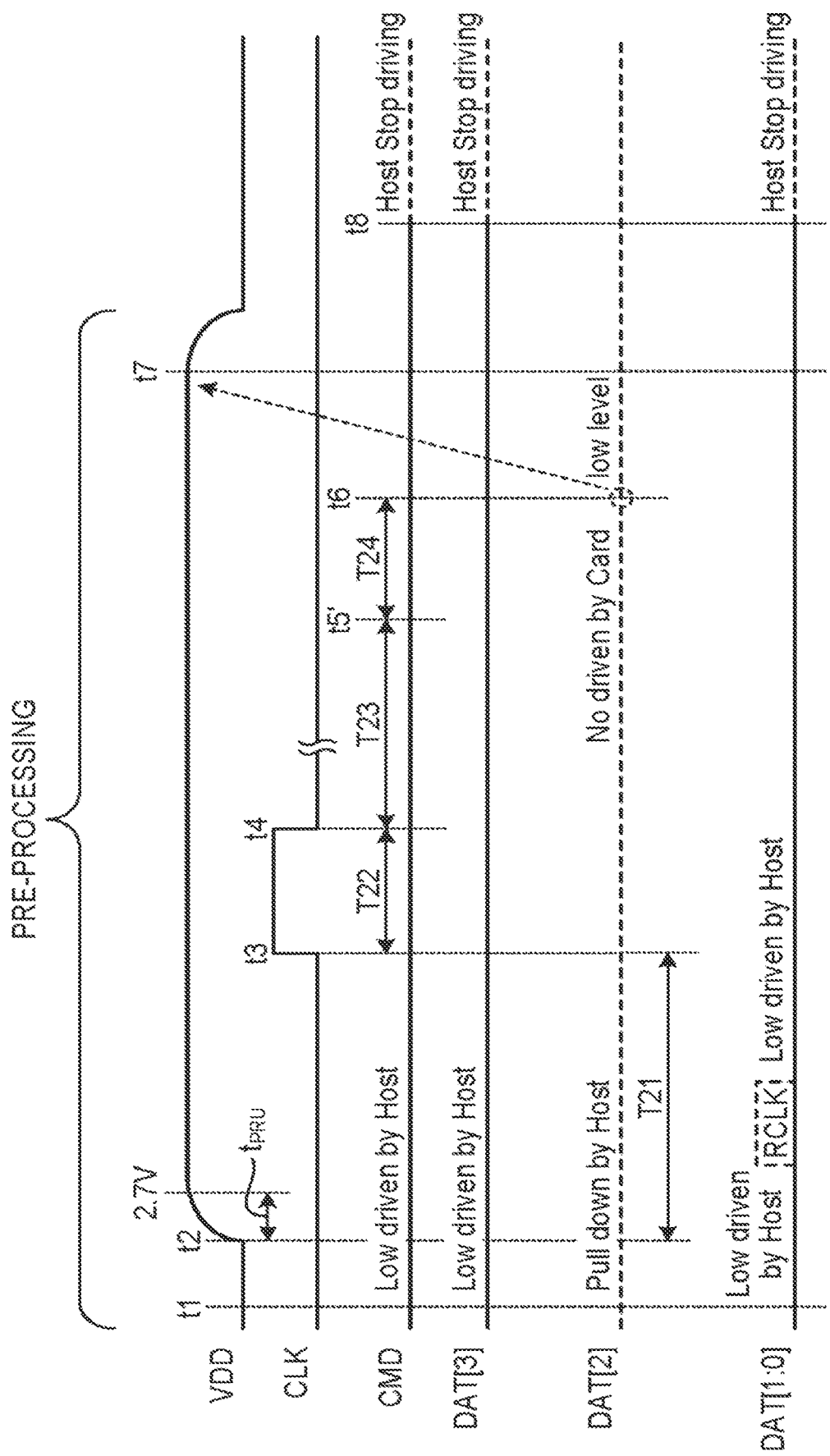
FIG. 18 is a timing chart describing the LVS identification sequence when an HVS device is attached to the LVS host according to the fifth embodiment.

FIG. 18 is a timing chart describing the LVS identification sequence when an HVS device is attached to the LVS host according to the fifth embodiment.

Referring to FIG. 18, the operations from the time t1 to the time t5' are the same as those described in FIG. 17. In the case where the extension device 3 is an HVS device, the extension device 3 does not drive the voltage of the data DAT[2]. Accordingly, the voltage level of the data DAT[2] is pulled down by the host 2.

Next, when the predetermined period of time T23+T24 has passed from the time t4 (t6), the host 2 checks the voltage level of the data DAT[2]. Then, when the voltage level of the data DAT[2] is Low by the host 2 pull-down, the host 2 recognizes the extension device 3 as an HVS device. Then, the host 2 stops the supply of the power-supply voltage to the extension device 3 (t7). Further, the host 2 stops the driving of the voltages of the command CMD and the data DAT[1:0] and DAT[3] (t8), and rejects the extension device 3.

Figure 19:
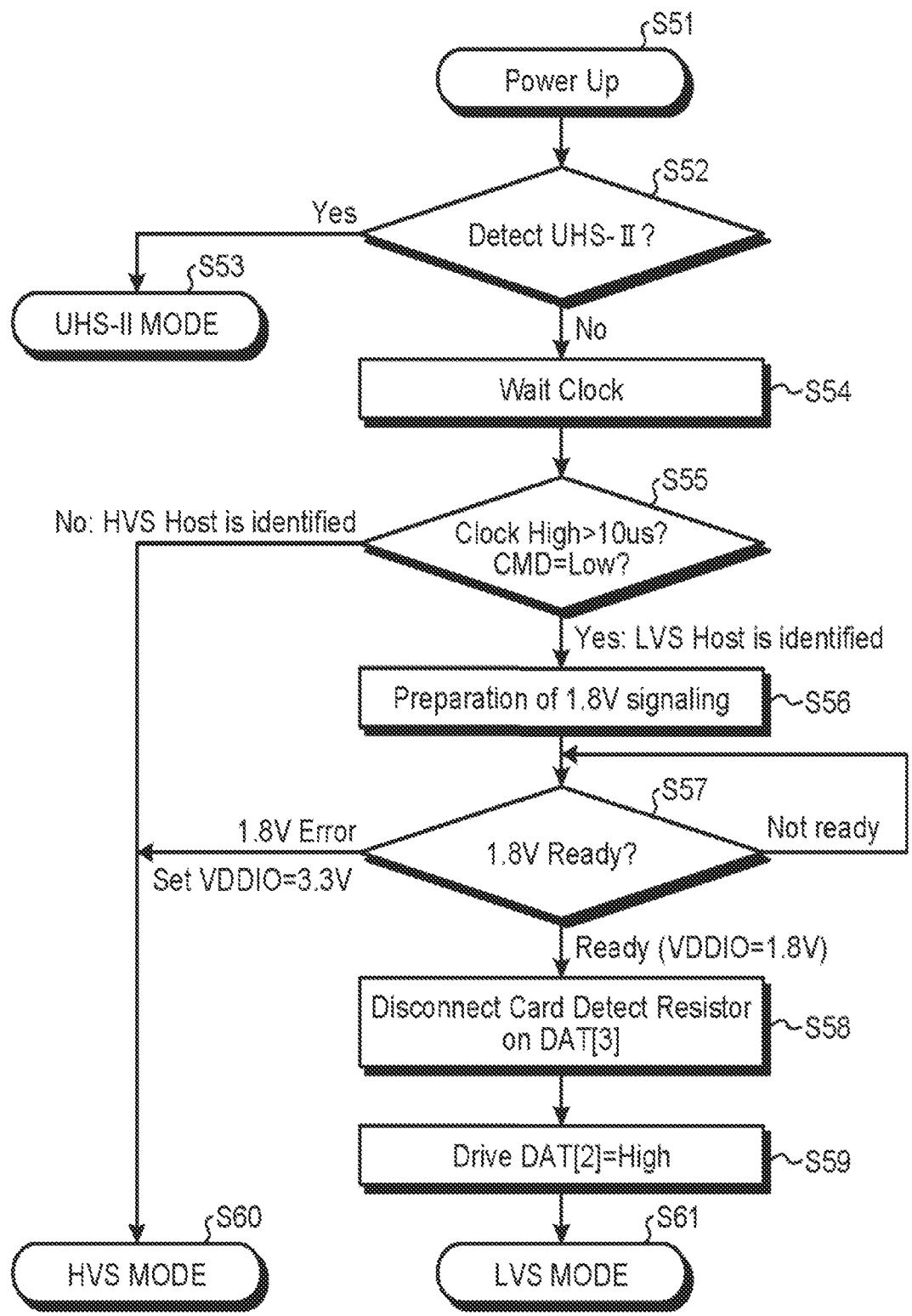
FIG. 19 is a flowchart of an LVS identification sequence and an initialization sequence of an extension device according to the fifth embodiment.
Figure 20:
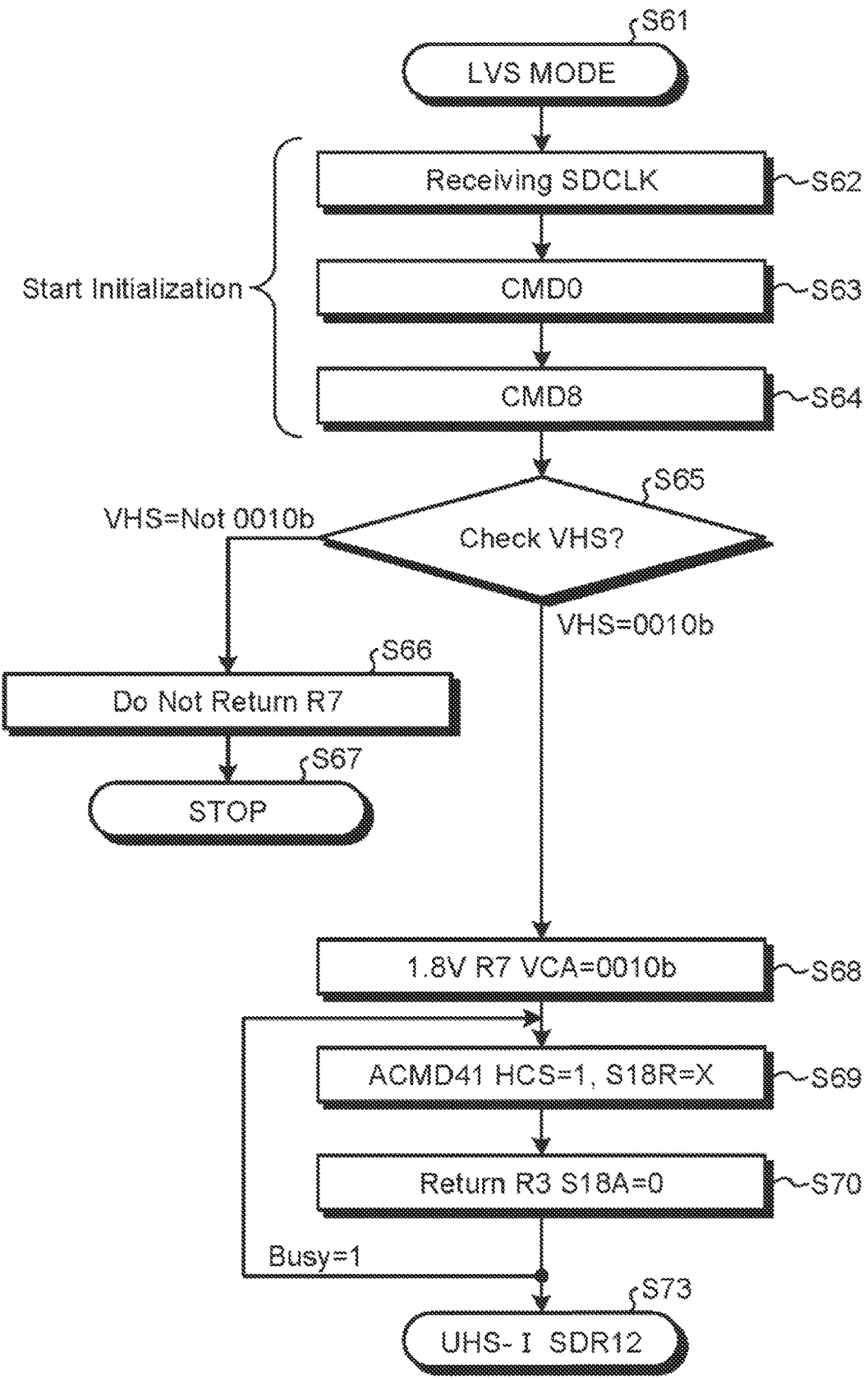
FIG. 20 is a flowchart of the LVS identification sequence and the initialization sequence of the extension device according to the fifth embodiment.

FIGS. 19 and 20 are flowcharts of a pre-processing and an initialization sequence of an extension device according to the fifth embodiment;

Referring to FIG. 19, when being powered on (S51), the extension device 4 checks on the UHS-II mode (S52). At the time of powering on the extension device 4, the I/O cell needs to be resistant to a high voltage signaling (3.3 V) as a default. Accordingly, the I/O cell needs to be supplied with a high voltage power (3.3 V). The command CMD and the data DAT[3:0] are managed by the host and are not driven by the extension devices 3 and 4 (however, the extension device 4 may drive the data DAT[2] in the LVS identification sequence t5').

When detecting the UHS-II mode, the extension device 4 moves to the UHS-II mode (S53). When not detecting the UHS-II mode, the extension device 4 moves to the state waiting for the clock CLK (S54).

Next, the extension device 4 checks clock high width and the voltage level of the command CMD (355). When clock high width is less than 10 us or the voltage level or the command CMD is not Low, the extension device 4 recognizes an HVS host (Host 1) and moves to the HVS mode (S60).

Meanwhile, when clock high width is more than 10 us and the voltage level of the command CMD is Low, the extension device 4 recognizes an LVS host (Host 2), and prepares for the operation with a low voltage signaling (1.8 V) (S56).

Then, when detecting any error during the switching to a low voltage signaling (1.8 V) (S57), the extension device 4 sets the power supply VDDIO of the I/O cell to a power-supply voltage (3.3 V), and moves to the HVS mode (S60). Meanwhile, when the preparation for the operation with a low voltage signaling (1.8 V) is made (S57), the extension device 4 disconnects the device detection resistor R4 (S58). Further, the extension device 4 drives the data DAT[2] High to indicate that it moves to the LVS mode (S61).

Next, referring to FIG. 20, the extension device 4 receives the clock SDCLK to move to the initialization process (S62). Upon receipt of the command CMD0, the extension device 4 performs the reset operation. (S63). Next, upon receipt of the command CMD8 (S64), the extension device 4 checks the field VHS (S65). When the command argument 00010b is not set in the Field VHS, the extension device 4 returns no response (S66) and stops the operation (S67).

When no error has occurred and the command argument 00010b is set, the extension device 4 returns a low voltage signaling response with VHS=00010b (S68).

Next, when operating with a low voltage signaling, upon receipt of the command ACMD41, the extension device 4 is not affected by setting of S18R (S69) and sets S18A=0, and returns a response to the command ACMD41 (S70). When the execution of the command ACMD41 is completed, the extension device 4 returns D31=1, and when the execution of the command ACMD41 is continued, the extension device 4 returns D31=0. The value of S18A is effective when D31=1. When the initialization command is already executed by a low voltage signaling, the extension device 4 returns S18A=0. At this time, the host 2 skips the voltage switch sequence (CMD11), and executes the steps subsequent from the issuance of the command CMD2 (S73).

Figure 21:
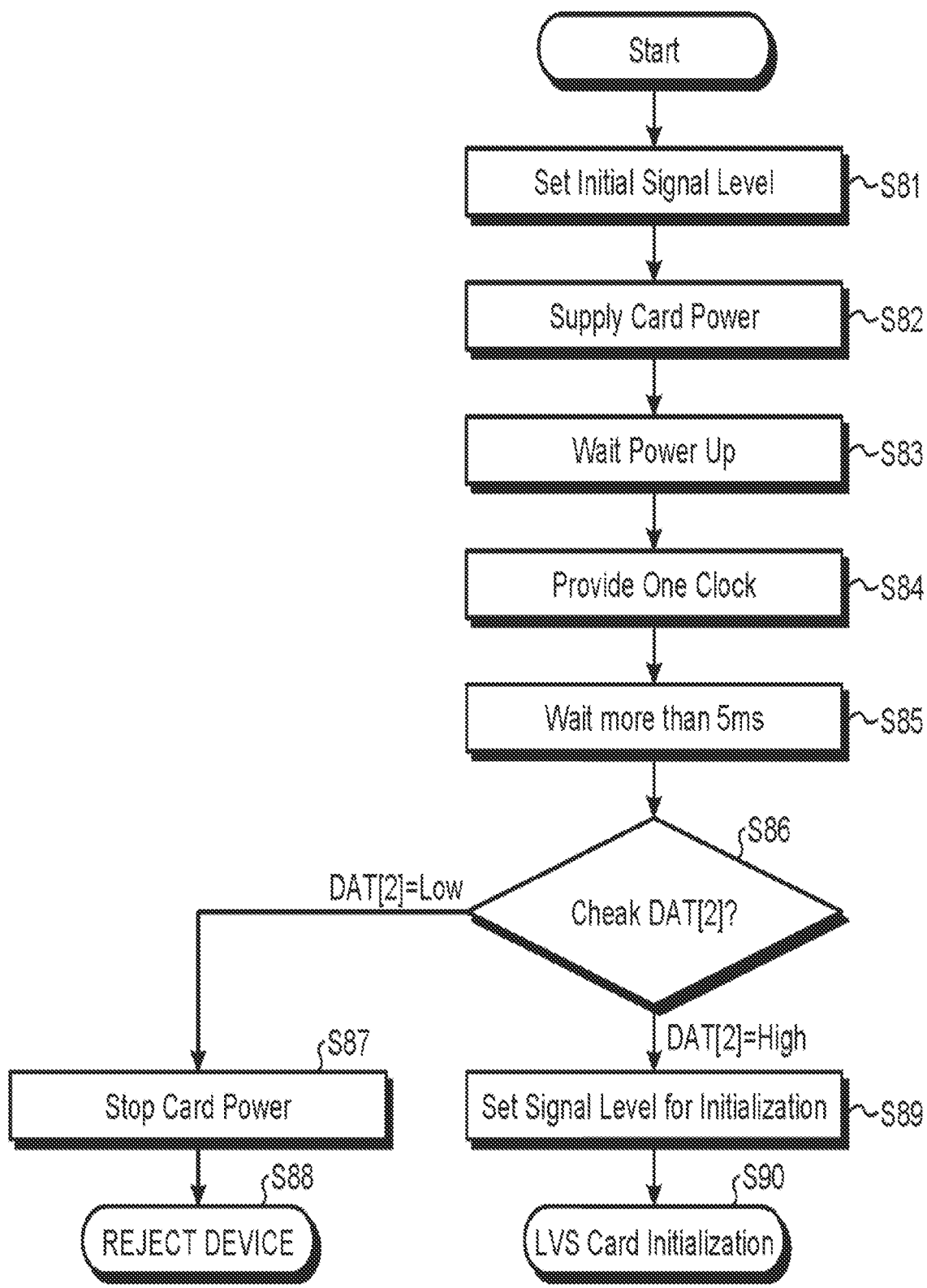
FIG. 21 is a flowchart of an LVS identification sequence and an initialization sequence of a host according to the fifth embodiment.
Figure 22:
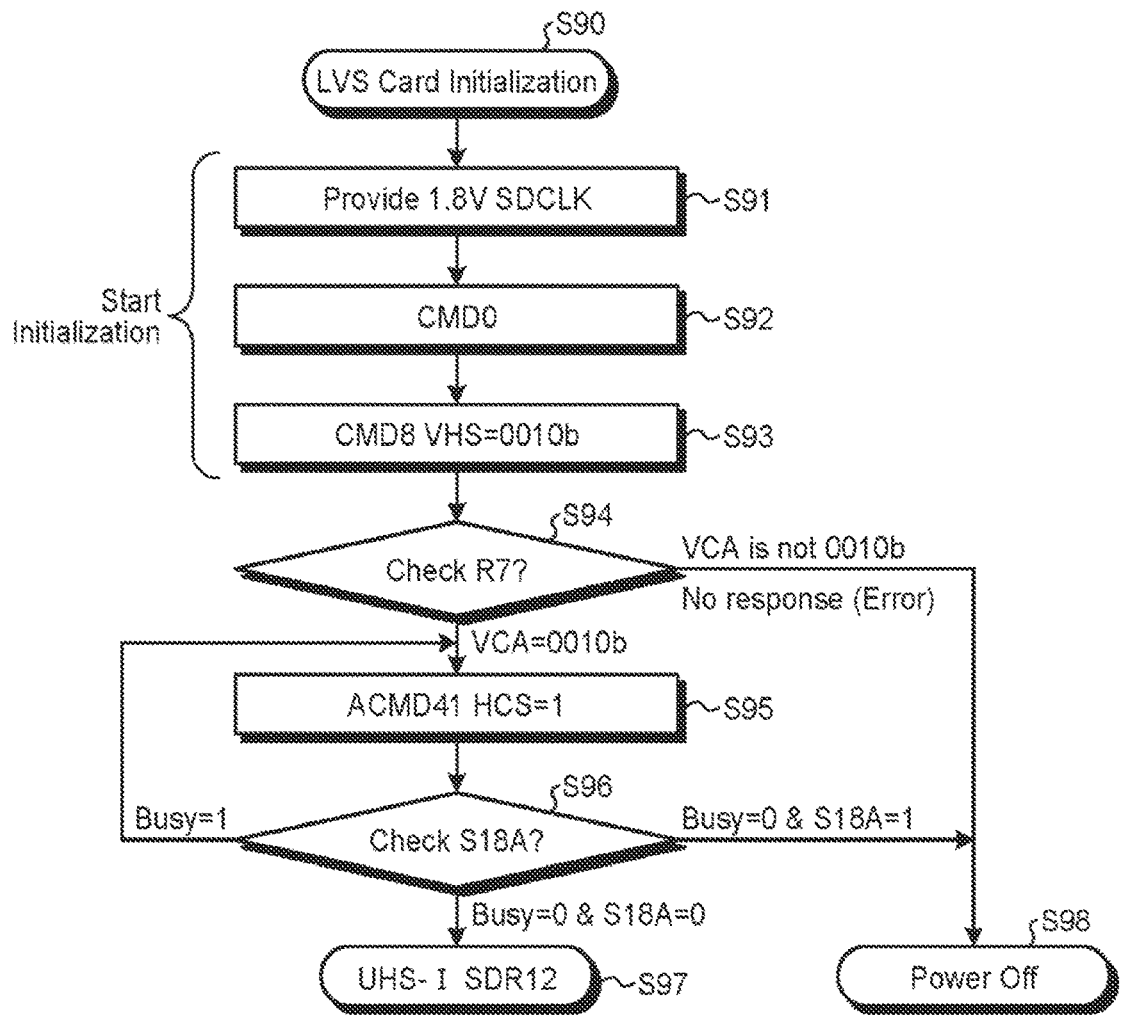
FIG. 22 is a flowchart of the LVS identification sequence and the initialization sequence of the host according to the fifth embodiment.

FIGS. 21 and 22 are flowcharts of a pre-processing and initialization sequence of the host according to the fifth embodiment.

Referring to FIG. 21, before power-on, the host 2 pulls down only the data DAT[2], and drives the others, that is, the clock SDCLK and the command CMD and the data DAT[3] and DAT[1:0] to Low (S81). Upon power-on (S82), the host 2 waits until the power to the extension devices 3 and 4 becomes stable (S83).

Next, the host 2 transmits the one clock pulse PL as the clock CLK to the extension devices 3 and 4 (S84). Next, after waiting for more than 5 ms (S85), for example, the host 2 checks the voltage level of the data DAT[2] (S86), Then, when the voltage level of the data DAT[2] is Low, the host 2 stops the power (S87) and rejects the device (S88).

Meanwhile, when the voltage level of the data DAT[2] is High, the host 2 recognizes the extension device 4 as an LVS device. At this time, the host 2 pulls up the command. CMD and the data DAT[3:0] (S89), and moves to the LVS Card Initialization. (S90).

Next, referring to FIG. 22, the host 2 starts the initialization process. At this time, the host 2 supplies the clock SDCLK of a low voltage signaling (1.8 V) (S91), and issues the command CMD0 (S92). Next, the host 2 sets the command argument 00010b to the field VHS of the CMD8, and issues the command CMD6 (S93). The subsequent commands in the initialization sequence are not described in the drawing.

Next, the host 2 checks any response to the issuance of the command. CMD6 (S94). In this example, the LVS device can return a response with the command argument 00010b set in the field VCA compatible with VHS. When there is no response from the LVS device, the host 2 rejects the LVS device and powers off the LVS device (S98). Meanwhile, when VCA=00010b in the response to the issuance of the command CMD8, the host 2 issues the initialization command ACMD41 (S95).

Then, the host 2 refers to the field D31 in the response to the initialization command ACMD41 so determine whether the device is in the busy state. When the device is not in the busy state, the host 2 checks a bit S18A included in the response to the command ACMD41 (S96). When the LVS device has switched the signal level to a low voltage signaling, S18A=0 is set to the response so that the voltage switch sequence (CMD11) is skipped. Then, the host 2 executes the steps subsequent from the issuance of the command CMD2 (S97). When the check on S18A reveals that S18A=1, the host 2 determines this as an error, and powers off the LVS device (S98).

Sixth Embodiment

Figure 23:
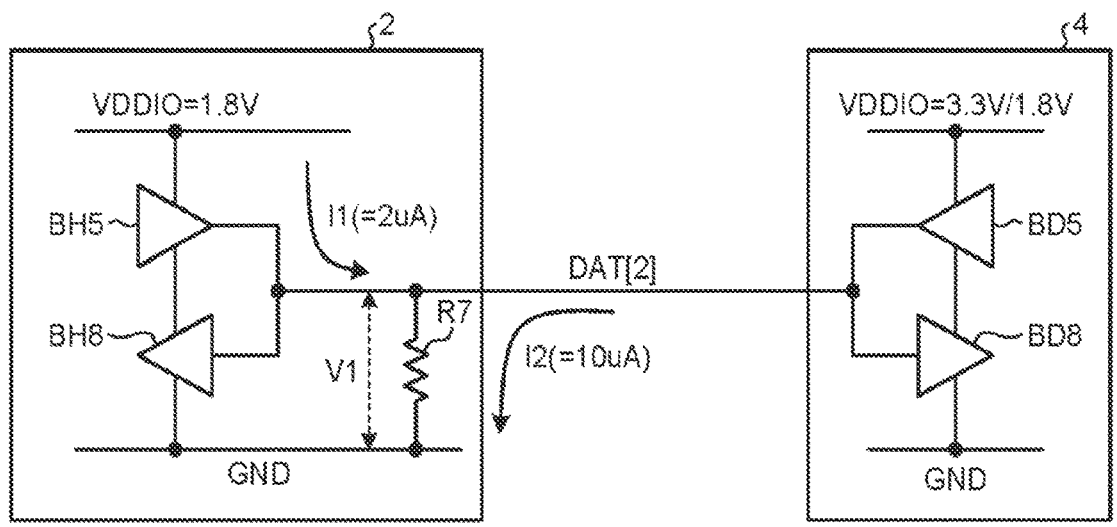
FIG. 23 is a block diagram illustrating the connection of a data line DAT[2] when an LVS device is attached to an LVS host according to a sixth embodiment.

FIG. 23 is a block diagram illustrating the connection of a data line DAT[2] when an LVS device is attached to an LVS host according to a sixth embodiment.

The host 2 can control pull-up resistor (R2) and pull-down resistor (R7) on DAT[2]. Only either of the pull-down and the pull-down resistors is activated and both are not activated at the same time. The value of the pull-down resistor R7 can be set within a range of 1.5 to 15 kΩ, for example.

Referring to FIG. 23, it shows when pull-down resistor R7 is selected. The value of the pull-down resistor R7 can be set within a range of 1.5 to 15 kΩ, for example.

For the pull-down, a voltage V1 applied to the pull-down resistor R7 needs to be set to less than 0.58 V that is the Low-level maximum input voltage of a low voltage signaling. The factors in deciding the value of the pull-down resistor are leak current and noise margin. In the illustrated case, when a current of 12 uA flows into the R7 and a noise margin of 400 mV is obtained, the relational expression of the pull-down resistor is 12 uA*R7+400 mV<0.58 V, and the result R7<15 KΩ is obtained from the inequality expression.

By providing the pull-down resistor R7, it is possible to pull down the data DAT[2] before the host 2 powers on the extension device 4. In addition, the extension device 4 can drive the data DAT[2] to High within the predetermined period of time T23, if 1.8V signaling is ready. The host 2 can check the voltage level of the data DAT[2] after passage of the predetermined period of time T23+T24 from the time t4, that is at t6. When the voltage level of the data DAT[2] is High, the host 2 can recognize the extension device 4 as an LVS device.

While certain embodiments have been described, these embodiments have been presented by way of example only, and are not intended to Limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A host apparatus configured to supply a power-supply voltage to a device and communicate with the device via signals of a clock, a command/response, and data, a first voltage signaling and a second voltage signaling lower than the first voltage signaling being usable for the communication as input/output signal levels of the signals, comprising:
   a power/ground terminal configured to supply the power-supply voltage to the device;
   a clock terminal configured to output the clock;
   a command terminal configured to transmit the command and receive the response;
   a plurality of data terminals including a $1^{st}$ data terminal to a $4^{th}$ data terminal, each being configured to perform input and output of the data;
   an I/O cell unit connected to the clock terminal, the command terminal, and the data terminals; and
   a device detection unit configured to detect whether the device is communicable under the second voltage signaling, wherein
   the host apparatus performs an initial setting where the host apparatus sets each of the clock terminal, the command terminal, the $1^{st}$ data terminal, the $2^{nd}$ data terminal, and the $4^{th}$ data terminal to a Low level, and where the host apparatus sets the $3^{rd}$ data terminal to the Low level or pulls down the $3^{rd}$ data terminal via a resistor under the second voltage signaling,
   the host apparatus supplies the power-supply voltage via the power/ground terminal to the device,
   the device detection unit outputs one clock pulse to the clock terminal after passage of a first certain period of time from a start of supplying the power-supply voltage,
   the host apparatus determines the device as a LVS (Low Voltage Signaling) device when signal level of the $3^{rd}$ data terminal has been inverted after passage of a second certain period of time from providing the one clock pulse.

2. The host apparatus of claim 1, wherein
when determining the device as the LVS device, the host apparatus sets each of the $1^{st}$ data terminal, the $2^{nd}$ data terminal, and $4^{th}$ data terminal to a High level or pulls up each of the $1^{st}$ data terminal, the $2^{nd}$ data terminal, and $4^{th}$ data terminal so as to perform, an initialization process of the device.

3. The host apparatus of claim 2, wherein
in the initialization process, the host apparatus outputs a clock to make the device stop driving of the $3^{rd}$ data terminal.

4. The host apparatus of claim 3,
after making the device stop driving of the $3^{rd}$ data terminal in the initialization process, the host apparatus pulls up the $3^{rd}$ data terminal, outputs predetermined numbers of clocks with the second voltage signaling to the device, and issues a first command and a second command.

5. The host apparatus of claim 4, wherein
the host apparatus makes the device power off when no response to the second command is received from the device.

6. The host apparatus of claim 1, wherein
a High-level period of the one clock is longer than a pre-determined value.

7. The host apparatus of claim 1, wherein
the host apparatus determines the device as a HVS (High Voltage Signaling) device when signal level of the $3^{rd}$ data terminal accords with a level set by the host apparatus after passage of the second certain period of time from providing the one clock pulse.

8. The host apparatus of claim 7, wherein
when determining the device as the HVS device, the host apparatus stops pulling up of the $3^{rd}$ data terminal and stops supplying the power-supply voltage to the device.

9. The host apparatus of claim 8, wherein
after the stop of supplying the power-supply voltage to the device, the host apparatus stops driving of the $1^{st}$ data terminal, the $2^{nd}$ data terminal, and the $4^{th}$ data terminal.

10. The host apparatus of claim 1, wherein
in the initial setting, the host apparatus pulls down the $3^{rd}$ data terminal via the resistor under the second voltage signaling.

11. The host apparatus of claim 1, further comprising a power switch, wherein
the host apparatus turns on the power switch for the power-supply voltage to be supplied from the host apparatus to the device.

* * * * *